(12) United States Patent
Noda

(10) Patent No.: US 6,850,573 B1
(45) Date of Patent: Feb. 1, 2005

(54) CODING APPARATUS AND METHOD, DECODING APPARATUS AND METHOD, AND RECORDING MEDIUM

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 564 days.

(21) Appl. No.: 09/655,434

(22) Filed: Sep. 5, 2000

(30) Foreign Application Priority Data

Sep. 6, 1999 (JP) .......................... 11-251670

(51) Int. Cl.[7] .............................. H04L 5/12

(52) U.S. Cl. .................. 375/262; 375/265; 375/341

(58) Field of Search ............... 375/265, 262, 375/341, 346; 714/752, 792

(56) References Cited

U.S. PATENT DOCUMENTS

| | | | | |
|---|---|---|---|---|
| 5,844,507 A | * | 12/1998 | Zook | 714/752 |
| 5,881,073 A | * | 3/1999 | Wan et al. | 714/786 |
| 6,032,284 A | * | 2/2000 | Bliss | 714/792 |
| 6,154,504 A | * | 11/2000 | Ino | 375/265 |

FOREIGN PATENT DOCUMENTS

| | | | | |
|---|---|---|---|---|
| EP | 0 713 296 | 5/1996 | ......... | H03M/13/00 |
| JP | 10 173536 | 6/1998 | ........... | H03M/7/14 |

OTHER PUBLICATIONS

Fitzpatrick J et al: "Partial response class 1 signaling applied to high density magnetic recording" Proc. of Global Telecommunications Conference 1993, Houston, USA, Nov. 29, 1993 (Nov. 11, 1993), pp. 1950–1954, XP010109979 ISBN:0–7803–0917–0.

Conway Tom et al: "Matched spectral null coding for magnetic recording with a 1+D channel" IEEE Trans. on Magnetics, vol. 33, No. 1 part 2, Jan. 1997 (Jan. 1997), pp. 863–867, XP002277311.

\* cited by examiner

*Primary Examiner*—Don N. Vo
(74) *Attorney, Agent, or Firm*—Frommer Lawrence & Haug LLP; William S. Frommer; Samuel S. Lee

(57) ABSTRACT

More code words are assigned to the data word. There are 71949 code words that can take the start point at the state 4 and there are 71949 code words that can take the start point at the state 5, and out of these code words, there are 27126 duplicate code words that can take the start point at both the state 4 and the state 5. In this example, the duplicate code word can be discriminated during decoding, and therefore assigned to the data word in one-to-one relation. Because 44823 (=71949−27126) code words that can take the start point at only the state 4 and 44823 code words that can take the start point at only the state 5 are different from each other, two code words, namely a code word that can take only the state 4 and a corresponding code word that can take only the state 5 are assigned to one data word. In other words, 71949 (=44823×2÷2+27126) code words are selected.

13 Claims, 17 Drawing Sheets

| STATE NUMBER | RDS* | ADS* | STATE NUMBER | RDS* | ADS* |
|---|---|---|---|---|---|
| 1 | 0 | 0 | 21 | 0 | -2 |
| 2 | +1 | +1 | 22 | +1 | +3 |
| 3 | -1 | +1 | 23 | -1 | +3 |
| 4 | +2 | 0 | 24 | +2 | -2 |
| 5 | -2 | 0 | 25 | -2 | -2 |
| 6 | +3 | +1 | 26 | +3 | +3 |
| 7 | -3 | +1 | 27 | -3 | +3 |
| 8 | +4 | 0 | 28 | +4 | -2 |
| 9 | -4 | 0 | 29 | -4 | -2 |
| 10 | +5 | +1 | 30 | +5 | +3 |
| 11 | 0 | +2 | 31 | 0 | +3 |
| 12 | +1 | -1 | 32 | +1 | -3 |
| 13 | -1 | -1 | 33 | -1 | -3 |
| 14 | +2 | +2 | 34 | +2 | +4 |
| 15 | -2 | +2 | 35 | -2 | +4 |
| 16 | +3 | -1 | 36 | +3 | -3 |
| 17 | -3 | -1 | 37 | -3 | -3 |
| 18 | +4 | +2 | 38 | +4 | +4 |
| 19 | -4 | +2 | 39 | -4 | +4 |
| 20 | +5 | -1 | 40 | +5 | -3 |

| STATE NUMBER | RDS* | ADS* | STATE NUMBER | RDS* | ADS* |
|---|---|---|---|---|---|
| 1 | 0 | +1 | 21 | 0 | +3 |
| 2 | +1 | 0 | 22 | +1 | −2 |
| 3 | −1 | 0 | 23 | −1 | −2 |
| 4 | +2 | +1 | 24 | +2 | +3 |
| 5 | −2 | +1 | 25 | −2 | −3 |
| 6 | +3 | 0 | 26 | +3 | −2 |
| 7 | −3 | 0 | 27 | −3 | −2 |
| 8 | +4 | +1 | 28 | +4 | +3 |
| 9 | −4 | +1 | 29 | −4 | +3 |
| 10 | +5 | 0 | 30 | +5 | −2 |
| 11 | 0 | −1 | 31 | 0 | −2 |
| 12 | +1 | +2 | 32 | +1 | +4 |
| 13 | −1 | +2 | 33 | −1 | +4 |
| 14 | +2 | −1 | 34 | +2 | −3 |
| 15 | −2 | −1 | 35 | −2 | −3 |
| 16 | +3 | +2 | 36 | +3 | +4 |
| 17 | −3 | +2 | 37 | −3 | +4 |
| 18 | +4 | −1 | 38 | +4 | −3 |
| 19 | −4 | −1 | | | |
| 20 | +5 | +2 | | | |

FIG. 12

| CODE LENGTH | NUMBER OF CODE WORDS | m/n | CODING RATE |
|---|---|---|---|
| 4 | 5 | 2/4 | 0.5 |
| 8 | 51 | 5/8 | 0.625 |
| 12 | 568 | 9/12 | 0.75 |
| 16 | 6390 | 12/16 | 0.75 |
| 20 | 71949 | 16/20 | 0.8 |
| 24 | 810121 | 19/24 | 0.792 |
| 28 | 9121465 | 23/28 | 0.821 |
| 32 | 102701231 | 26/32 | 0.813 |
| 36 | 1156340544 | 30/36 | 0.833 |
| 40 | 13019540098 | 33/40 | 0.825 |

FIG. 13

| DATA WORD | CODE WORD |
|---|---|
| 0000000000000000 | 00001000001000001000 |
| 0000000000000001 | 00001000001000001010 |
| 0000000000000010 | 00001000001000001101 |
| 0000000000000011 | 00001000001000010001 |
| 0000000000000100 | 00001000001000010100 |
| 0000000000000101 | 00001000001000010110 |
| 0000000000000110 | 00001000001000011011 |
| 0000000000000111 | 00001000001000100010 |
| 0000000000001000 | 00001000001000100101 |
| 0000000000001001 | 00001000001000101000 |
| 0000000000001010 | 00001000001000101010 |
| 0000000000001011 | 00001000001000101101 |
| 0000000000001100 | 00001000001000110001 |
| 0000000000001101 | 00001000001000110100 |
| 0000000000001110 | 00001000001000110110 |
| 0000000000001111 | 00001000001000111011 |
| 0000000000010000 | 00001000001001000100 |
| 0000000000010001 | 00001000001001001011 |
| 0000000000010010 | 00001000001001010010 |
| 0000000000010011 | 00001000001001010101 |
| 0000000000010100 | 00001000001001011010 |
| 0000000000010101 | 00001000001001011101 |
| 0000000000010110 | 00001000001001100011 |
| 0000000000010111 | 00001000001001101001 |
| 0000000000011000 | 00001000001001101100 |
| 0000000000011001 | 00001000001001101110 |
| 0000000000011010 | 00001000001001110111 |
| 0000000000011011 | 00001000001010010001 |
| 0000000000011100 | 00001000001010010110 |
| 0000000000011101 | 00001000001010100010 |
| 0000000000011110 | 00001000001010100101 |
| 0000000000011111 | 00001000001010101010 |

FIG. 15

| STATE NUMBER | RDS | ADS | STATE NUMBER | RDS | ADS |
|---|---|---|---|---|---|
| 1 | −4 | +4 | 26 | +2 | 0 |
| 2 | −2 | +4 | 27 | +4 | 0 |
| 3 | 0 | +4 | 28 | −5 | −1 |
| 4 | +2 | +4 | 29 | −3 | −1 |
| 5 | +4 | +4 | 30 | −1 | −1 |
| 6 | −5 | +3 | 31 | +1 | −1 |
| 7 | −3 | +3 | 32 | +3 | −1 |
| 8 | −1 | +3 | 33 | +5 | −1 |
| 9 | +1 | +3 | 34 | −4 | −2 |
| 10 | +3 | +3 | 35 | −2 | −2 |
| 11 | +5 | +3 | 36 | 0 | −2 |
| 12 | −4 | +2 | 37 | +2 | −2 |
| 13 | −2 | +2 | 38 | +4 | −2 |
| 14 | 0 | +2 | 39 | −5 | −3 |
| 15 | +2 | +2 | 40 | −3 | −3 |
| 16 | +4 | +2 | 41 | −1 | −3 |
| 17 | −5 | +1 | 42 | +1 | −3 |
| 18 | −3 | +1 | 43 | +3 | −3 |
| 19 | −1 | +1 | 44 | +5 | −3 |
| 20 | +1 | +1 | 45 | −4 | −4 |
| 21 | +3 | +1 | 46 | −2 | −4 |
| 22 | +5 | +1 | 47 | 0 | −4 |
| 23 | −4 | 0 | 48 | +2 | −4 |
| 24 | −2 | 0 | 49 | +4 | −4 |
| 25 | 0 | 0 | | | |

CODING APPARATUS AND METHOD, DECODING APPARATUS AND METHOD, AND RECORDING MEDIUM

BACKGROUND OF THE INVENTION

1. Field of the Invention

This invention relates to a coding apparatus and method, a decoding apparatus and method, and a recording medium, and more particularly relates to a coding apparatus and method, a decoding apparatus and method, and a recording medium that are capable of performing coding processing and decoding processing with a simple structure.

2. Description of the Related Art

FIG. 1 shows an exemplary structure of a conventional recording/reproduction apparatus 1. In the recording/reproduction apparatus 1, trellis coding processing of the coding rate of 16/20 is performed, which is being practically used in AIT2 (Advanced Intelligent Tape System 2) tape streamer system (tape streamer drive system; product of Sony Corp.) disclosed in Japanese Patent Application No. Hei 10-207372.

For example, the video data and/or audio data to be recorded in a medium 2 are supplied to a coder 11 in units of m (=16) bits. The coder 11 converts (codes) the input data word of 16 bits to the coded word having a code length of n (=20) bits, and supplied it to a D/A converter 12. The D/A converter 12 subjects the coded word supplied from the coder 11 to NRZ (non-return to zero) modulation (modulation in which the coded word corresponds to recording (transfer) waveform as it is) to convert it to the recording short waveform, and supplies it to a recording/reproducing apparatus 13.

The recording/reproducing apparatus 13 comprising a magnetic head records the recording short waveform supplied from the D/A converter 12 on the medium 2 (magnetic tape). The recording/reproducing apparatus 13 reproduces the signal recorded on the medium 2, and supplies the reproduced signal (reproduced wave) to an analog equalizer 14.

The analog equalizer 14 equalizes the reproduced wave supplied from the recording/reproducing apparatus 13 to the predetermined target equalization characteristic and then supplied the equalized wave to an A/D converter 15. The A/D converter 15 converts the equalized wave supplied from the analog equalizer 14 to the digital signal, and supplies it to the code detector 16. In the case that the equalization by means of the analog equalizer 14 is supposed to be not sufficient, a digital equalizer may be provided between the A/D converter 15 and the code detector 16.

The code detector 16 comprising a maximum likelihood detector calculates the likelihood degree based on the equalization signal supplied from the A/D converter 15, detects the code word of 20 bits based on the calculation result (maximum likelihood), and supplies the code word to a decoder 17.

The decoder 17 decodes the code word of 20 bits supplied from the code detector 16 to the data word of 16 bits, and supplies it to an external error corrector.

In the case of this example, an error corrector (ECC (error correction code)) for correcting the output data is omitted.

FIG. 2 shows an exemplary structure of the coder 11. A coding circuit 21 converts the input data word of 16 bits to the code word having a code length of 20 bits, and supplies it to a state detection circuit 22 and a code word conversion circuit 25. In the case of this example, the code word converted by the coding circuit 21 takes the sequence of RDS (running digital sum) and ADS (alternating digital sum) that satisfy seven restrictions, namely the first to seventh restrictions described below:

The first restriction: "ADS ranges from 0 to 10 or the RDS amplitude (DSV (digital sum variation)) is 10, and ADS ranges from 0 to 10 or the ADS amplitude (ADSV (alternating digital sum variation)) is 10."

The second restriction: "The start point state and the end point state should be state (3, 3), state (3, 7), state (7, 3), and state (7, 7) in the finite state transition diagram shown in FIG. 3." Each state is represented as state (ADS, RDS) in the finite state transition diagram shown in FIG. 3.

The third restriction: "(1) A path started from the state having ADS of 3 at the time 0 should not pass the state having ADS of 0 and the state having ADS of 2 at the time 7. (2) A path started from the state having ADS of 7 at the time 0 should not pass the state having ADS of 8 and the state having ADS of 10 at the time 7."

The fourth restriction: "(1) A path started from the state having RDS of 3 at the time 0 should satisfy the following four restriction, the path:
  (a) should not pass the state having RDS of 0 at the time 3,
  (b) should not pass the state having RDS of 10 at the time 7,
  (c) should not transit to the state having RDS of 10 at the time 15 from the state having RDS of 0 at the time 5 with increment of RDS one by one, and
  (d) should not transit to the state having RDS of 10 at the time 17 from the state having RDS of 0 at the time 7 with increment of RDS one by one.
  (2) A path started from the state having RDS of 7 at the time 0 should satisfy the following four restrictions, the path;
  (a) should not pass the state having RDS of 10 at the time 3,
  (b) should not pass the state having RDS of 0 at the time 7,
  (c) should not transit to the state having RDS of 0 at the time 15 from the state having RDS of 10 at the time 5 with increment of RDS one by one, and
  (d) should not transit to the state having RDS of 10 at the time 7 from the state having RDS of 0 at the time 17 with increment of RDS one by one."

The fifth restriction: "(1) In the case that the start point of the code coded by means of the coding circuit 21 is the state (3, 3), the path having ADS of 3 at the time 6, ADS of 4 at the time 4, and ADS of 3 at the time 8 out of the paths started from this state at the time 0 should not have RDS of 7 at any time.

(2) In the case that the start point of the code coded by means of the coding circuit 21 is the state (3, 7), the path having ADS of 3 at the time 6, ADS of 4 at the time 8, and ADS of 3 at the time 8 out of the paths started from this state at the time 0 should not have RDS of 3 at any time.

(3) In the case that the start point of the code coded by means of the coding circuit 21 is the state (7, 3), the path having ADS of 7 at the time 6, ADS of 6 at the time 7, and ADS of 7 at the time 8 out of the paths started from this state at the time 0 should not have RDS of 7 at any time, (4) In the case that the start point of the code coded by means of the coding circuit 21 is the state (7, 7), the path having ADS of 7 at the time 6, ADS of 6 at the time 7, and ADS of 7 at the time 8 out of the paths started from this state at the time 0 should not have RDS of 3 at any time."

The sixth restriction: "(1) In the case that RDS of the start point of the code coded by means of the coding circuit 21 is 3, the path having RDS of 6 at the time 3 out of the paths started from this state at the time 0 should have RDS of 7 at some time.

(2) In the case that RDS of the start point of the code coded by means of the coding circuit 21 is 7, the path having RDS of 4 at the time 3 out of the paths started from this state at the time 0 should have RDS of 3 at some time.

The seventh restriction: "(1) In the case that RDS of the start point of the code coded by means of the coding circuit 21 is 3, the path started from this state at the time 0 should satisfy the following four restrictions, the path;
- (a) should not have RDS of 1 at the time 2, RDS of 2 at the time 3, RDS of 1 at the time 4, and RDS of 7 or larger at any time,
- (b) should not have RDS of 1 at the time 4, RDS of 2 at the time 5, RDS of 1 at the time 6, and RDS of 9 at the time 14, and RDS of 8 at the time 15, and RDS of 9 at the time 16,
- (c) should not have RDS of 1 at the time 6, RDS of 2 at the time 7, RDS of 1 at the time 8, and RDS of 9 at the time 16, and RDS of 8 at the time 17, and RDS of 9 at the time 18, and
- (d) should not have RDS of 9 at the time 6, RDS of 8 at the time 7, and RDS of 9 at the time 8.

(2) In the case that RDS of the start point of the code coded by means of the coding circuit 21 is 7, the path started from this state at the time 0 should satisfy the following four restrictions, the path;
- (a) should not have RDS of 9 at the time 2, RDS of 8 at the time 3, RDS of 9 at the time 4, and RDS of 3 or smaller at any time,
- (b) should not have RDS of 9 at the time 4, RDS of 8 at the time 5, RDS of 9 at the time 6, and RDS of 1 at the time 14, and RDS of 2 at the time 15, and RDS of 1 at the time 16,
- (c) should not have RDS of 9 at the time 6, RDS of 8 at the time 7, RDS of 9 at the time 8, RDS of 1 at the time 16, RDS of 2 at the time 17, and RDS of 1 at the time 18, and
- (d) should not have RDS of 1 at the time 6, RDS of 2 at the time 7, and RDS of 1 at the time 8."

As described above, RDS and ADS are restricted.

Next, the first restriction, the third restriction, and the fourth restriction will be described out of the above-mentioned seven restrictions.

At first, the first restriction will be described. Recently, as one effective method for reducing the code error rate of digital transmission signal, the trellis coding modulation has been studied and developed. The trellis coding modulation is a method for calculating the maximum likelihood by applying the coding rule used in the coder 11 shown in FIG. 1 to the maximum likelihood calculation in the code detector 16. The minimum Euclidean distance is increased and the code error rate is decreased by detecting the maximum likelihood by means of this method.

As one of codes used for trellis coding modulation, MSN (matched spectral null) code in which the amplitude (DSV) of RDS and/or the amplitude (ADSV) of ADS is restricted to a finite value and the null point of the code spectrum on the frequency axis is identical with the null point of the equalization signal spectrum has been known.

MSN code for the dicode equalization channel having (1−D) (D denotes the delay operator for representing 1 bit delay on the frequency axis) equalization characteristic is provided by applying a method in which ADSV is controlled below a certain value, namely DSV is rendered finite, and the DC component of the code spectrum is rendered null (by removing DC component).

Furthermore, MSN code for the duobinary channel, namely PR1 (partial response class-I) equalization channel having (1+D) equalization characteristic or PR2 (partial response class-II) equalization channel having $(1+D)^2$ equalization characteristic is provided by applying a method in which ADSV is controlled below a certain value, namely ADSV is rendered finite, and the Nyquist frequency component is rendered null (by removing Nyquist frequency component).

MSN code for PR4 (partial response class-IV) equalization channel having (1−D)(1+D) equalization characteristic is provided by applying a method in which the code is subjected to interleave every 1 bit and the DC component of the code spectrum and Nyquist frequency components of the code are both rendered null. Kretzmer proposes the partial response classification such as PR1, PR2, or PR4, and the detail is presented in the literature: [3] E. R. Kretzmer, "Generalization of a Technique for Binary Data Communication" IEEE Trans. on com. Tech., pp.67–78, February 1966.

The equalization channel such as PR1 equalization or PR2 equalization having the equalization characteristic represented by polynominal expression of $(1+D)^x$ (x is a natural number) is more effective in high frequency band suppression than the equalization channel such as PR4 equalization or EPR4 (extended PR4) equalization having the equalization characteristic represented by polynominal expression of $(1-D)(1+D)^x$, as the result the higher line recording density is obtained in the case that the track width is the same.

PR1 equalization and PR2 equalization are described further below. As described above, in PR1 equalization and PR2 equalization, though Nyquist frequency of the code spectrum is removed, it is required to remove the DC component of the code spectrum when PR1 equalization or PR2 equalization is used because DC component of the equalization signal spectrum is included in PR1 equalization and PR2 equalization.

When the equalization channel (PR1 equalization and PR2 equalization) that include DC component of the equalization signal spectrum and the recording signal from which DC component of the code spectrum is not removed are used combinedly, for example, in the case that the recording/reproduction apparatus 1 is a magnetic recording/reproducing apparatus (in the case that the medium 2 is, for example, a magnetic disc or a magnetic tape), because the equalization signal spectrum requires DC component though DC component has not been transmitted, the noise amplification near DC component is very large in the analog equalization processing by means of the analog equalizer 14, and as the result SN ratio becomes very poor. In the case that the recording/reproducing apparatus 1 is an optical recording/reproducing apparatus (in the case that the medium 2 is, for example, an optical disc or a magneto-optic disc), because DC component of the code spectrum is not removed from the recording code though DC component has been transmitted, the low frequency component of the reproduced signal fluctuates and the reference level fluctuates, and as the result the phase sync circuit PLL (Phase Locked Loop) could operate erroneously or the servo signal could be supplied not surely.

On the reason described above, it is necessary to intercept (remove) DC component (DC component of the recording code) of the code spectrum when PR1 equalization or PR2 equalization is applied. In other words, it is necessary to use a code from which DC component and Nyquist frequency component have been removed (referred to as DC/Nyquist free code hereinafter).

Two methods used to null (remove) both DC component and Nyquist frequency component of the code spectrum are available. The one is (1) a code word is generated based on the finite state transition diagram having finite DSV and the generated code word is subjected to interleave every 1 bit, and the other is (2) a code word is generated based on the finite state transition diagram having finite DSV and finite ADSV. In the case of the method (1), DSV after interleave is double the DSV before interleave and ADSV after interleave is double the ADSV before interleave. Therefore, for example, in the case of PR1 equalization that is the method in which the code is observed continuously to detect the code, the number of states during code detection is double in comparison with the case of PR4 that is the method in which the code is observed every 1 bit to detect the code.

On the other hand, in the case of the method (2), the value of DSV and ADSV obtained by observing the code continuously is restricted to the small value easily. Therefore, in the case of this example, the code is generated based on the finite state transition diagram shown in FIG. 3 in which the method (2) is employed, RDS is restricted in a range from 0 to 10 and DSV is restricted to 10 (finite), and ADS is restricted in a range from 0 to 10 and ADSV is restricted to 10 (finite) by means of the first restriction. In other words, by means of the first restriction, DC component and Nyquist frequency component of the code spectrum are removed from the code word.

There are 57 states in the finite state transition diagram shown in FIG. 3, "0" or "1" generated from the state indicates the NRZ code output by NRZ modulation of the code word in the D/A converter 12. In other words, the finite state transition diagram is structured on the premise of NRZ modulation.

In the finite state transition diagram, RDS and ADS in each state are assigned so that the difference between RDS and ADS is an even number (including 0) (both RDS and ADS are an even or odd number). Though the finite state transition diagram can be structured so that the difference between RDS and ADS is an odd number, in this case, because the number of code words to be generated is usually less than that to be generated in the coding processing based on the finite state transition diagram shown in FIG. 3 in many cases, the coding processing based on the odd number finite state transition diagram is not used.

The Shannon capacity in the finite state transition diagram shown in FIG. 3 is 0.8962. The Shannon capacity is the theoretical maximum value of the code conversion efficiency that is achievable for the code that satisfies the restriction condition of a certain finite state transition diagram.

The structuring method for structuring a finite state transition diagram on the premise that DSV and ADSV are both finite and NRZ modulation is applied as in the case of the finite state transition diagram shown in FIG. 3 is disclosed in, for example, the literature [4] L. J. Fredrickson, "On the Shannon Capacity of DC- and Nyquist-Free Codes," IEEE Trans. on Info. Theory, Vol. 37, No. 3, May 1991.

Next, the third restriction will be described. To use MSN code, it is necessary to remove all the sequences having the estimation signal that cannot be likely finalized when the maximum likelihood is detected in the code detector 16, namely quasi-catastrophic sequence (referred to as QCS hereinafter) from the sequences. The time-varying trellis method is available as one effective method for removing QCS in MSN code, and the time-varying trellis method includes some methods such as trellis removing method (pruned trellis), state rearrangement method (state permutation), and set partitioning method or the like. In this example, the set partitioning method is employed.

According to the set partitioning method, ADS of the code word that starts from the state with ADS of 3 out of codes that start from any one of the state (3, 3), state (3, 7), state (7, 3), and state (7, 7) shown in the second restriction should not be 3 or smaller at any one time, and the ADS of the code word that starts from the state with ADS of 7 should not be equal to 7 or larger at any one same time, and in the case of this example, the time that is subjected to restriction is assigned to the time 7. In other words, by applying the third restriction, QCS is removed by means of the set portioning method. The detailed description of various time-varying trellis methods are disclosed in the literature [1] L. Fredrickson, et al., "Improved trellis-coding for partial-response channels," IEEE Trans. on Magn., Vol. 31, No. 2, pp. 1141–1148, March 1995. The inventor of the present invention has also developed a QCS deletion method according to a new trellis removing method already, and the detail is disclosed in the literature [2] M. Noda, "High-Rate Matched Spectral Null Code", IEEE Trans. on Magn., Vol. 34, No. 4, pp. 1946–1948, 1998 (or Japanese Patent Application No. Hei 09-347649)

In the trellis diagram (described hereinafter), the maximum bit length (referred to as TD (truncation depth) hereinafter) for summing the minimum Euclidean distance indicates the minimum length of path memory that is required for the code detector 16. Because TD in the trellis diagram corresponding to the code from which all the QCS are removed is finite, the code detector 16 has the path memory for it, on the other hand in the case that all the QCS are not removed, because TD in the trellis diagram is infinite, the infinite path memory is required for the code detector 16. Actually such code detector 16 is unrealistic, it is necessary that all the QCS are removed without exception.

Even in the case that TD is finite, it is required for the code detector 16 to have the path memory sufficient for it. Therefore, TD is desirably as short as possible to simplify the structure of the code detector 16.

For example, in the case that a code detector having a finite path memory is used for the code from which QCS has not been removed or in the case that a code detector having a path memory shorter than TD is used for the code from which QCS has been removed, the error rate after code detection is poor.

Next, the fourth restriction will be described. The same bit occurs sequentially most continuously in the case that RDS increases one by one from the minimum RDS to the maximum RDS and in the case that RDS decreases one by one from the maximum RDS to the minimum RDS in the finite state transition diagram shown in FIG. 3. In detail, the length of the maximum sequential same bit (referred to as the maximum sequential length Tmax hereinafter) is 10T (T=clock time interval).

If the maximum sequential length Tmax is large, for example, the over write erasion rate in magnetic recording/reproduction is reduced, over write noise increases, SN ratio of equalization signal becomes poor, cross talk from adjacent track becomes large in azimuth recording, and the data is reproduced not correctly. The information for synchronization (phase error information) decreases in PLL, and erroneous operation occurs. On the above-mentioned reason, the maximum sequential length is desirably as short as possible.

By inhibiting the transition from the state having RDS of 0 to the state having RDS of 10 through 10 times state transition and by inhibiting the transition from the state having RDS of 10 to the state having RDS of 0 through 10 times state transition in the finite state transition diagram shown in FIG. 3, all the code words that likely have the maximum sequential length Tmax of 10T are removed, and the maximum sequential length Tmax will be 9T. In other words, by applying the fourth restriction, all the code words having the maximum sequential length Tmax of 10T are removed, and the maximum sequential length will be 9T.

The description returns to FIG. 2. The state detection circuit 22 detects the state of the end point of the code word supplied from the coding circuit 21, and supplies it to the end point state correction circuit 23 as a temporary state of the end point of the cord word that is to be coded this time. The state detection circuit 22 detects the type of the input code word, and supplies the code word type parity that indicates the type of the detected code word to a code word conversion circuit 25.

The end point correction circuit 23 operates the end point state of the code word that is to be generated this time from the code word conversion circuit 25 based on the state supplied from the state detection circuit 22 (temporary state of the end point) and the start point of the code word to be generated this time from the code word conversion circuit 25 stored in a register 24 (the state of the end point of the code word generated previously from the code word conversion circuit 25), and supplies it to the register 24.

The code word conversion circuit 25 receives the code word supplied from the coding circuit 21, the code word type parity supplied from the state detection circuit 22, and the state supplied from the register 24. The code word conversion circuit 25 converts the cord word supplied from the coding circuit 21 to the code word having the starting point of the state supplied from the register 24 based on the type of the code word indicated by means of the code word type parity supplied from the state detection circuit 22.

Next, the outline of the coding processing in the coder 21 will be described. In the finite state transition diagram shown in FIG. 3, there are 124416 code words that satisfy the second restriction. Out of these cord words, 82944 cord words have the start point state of the state (7, 3) and satisfy the third restriction (in this case (2)), 82944 cord words have the start point state of the state (3, 7) and satisfy the third restriction (in this case (1)), and these code words are in the total inversion code relation each other. In other words, "0" is converted to "1" and "1" is converted to "0" of the one code word (referred to as total inversion operation hereinafter), and thus the one code word is converted to the other code word.

There are 88992 code words that have the start point state of the state (7, 7) and satisfy the third restriction (in this case (2)) out of code words that satisfy the second restriction (124416 code words), and there are 88992 code words that have the start point state of the state (3, 3) and satisfy the third restriction (in this case (1)), these code words are in the total inversion code relation each other.

Therefore, for example, the code words coded with the start point state fixed at the state (7, 3) are converted easily to the code words having the start point state of the state (3, 7) by applying total inversion operation. Similarly, the code words coded with the start point state fixed at the state (7, 7) are converted easily to the code words having the start point state of the state (3, 3).

However, in the finite state transition diagram shown in FIG. 3, the code words that have the start point state of the state (7, 3) and satisfy the third restriction and the code words that have the start point state of the state (7, 7) and satisfy the third restriction are not in total inversion relation each other. Similarly, the code words that have the start point state of the state (3, 3) and satisfy the third restriction and the code words that have the start point state of the state (3, 7) and satisfy the third restriction are not in total inversion relation each other.

Therefore, the code words coded with the start point state fixed at the state (7, 3) are converted not easily to the code words having the start point state of the state (7, 7), and the code words coded with the start point state fixed at the state (3, 3) are converted not easily to the code words having the start point state of the state (3, 7). In view of the above, in the case of this example, 70773 code words that are accommodable for all the start point states out of 124416 code words that satisfy the second restriction are used by performing partial inversion in units of 2 bits.

All the code words that likely have the maximum sequential length Tmax of 10T are removed from these code words (70773 code words) by applying the fourth restriction, and arbitrary 65536 ($=2^{16}$) code words are selected from among the residual code words, and these code words are assigned to the data word.

As described above, the coding processing is performed.

FIG. 4 shows an exemplary structure of the decoder 17. A state detection circuit 31 receives the 20 bit code word detected by means of the code detector 16. The state detection circuit 31 detects the start point state (RDS and ADS, total 2 bits) of the code word from the input code word, and supplies the detected start point state to a code correction circuit 32 as the temporary state of the start point of the code word to be decoded this time. The state detection circuit 31 detects the type of the code word from the input code word, and supplies the code word type parity that indicates the detected type to the code word correction circuit 32.

The code word correction circuit 32 receives not only the temporary state of the start point and the code word type parity from the state detection circuit 31 but also the code word from the code detector 16 directly. The code word correction circuit 32 corrects the code word supplied from the code detector 16 based on the temporary state of the start point supplied from the state detection circuit 31 and the code word type indicated by means of the code word type parity, and supplies the corrected code word to a decoding circuit 33. The decoding circuit 33 decodes the code word supplied from the code correction circuit 32 to generate the 16 bit data word, and supplies the data word to the external apparatus.

FIG. 5 shows an ADS trellis diagram used for detecting MSN code to which PR1 equalization is applied. In the ADS trellis diagram, the least-square Euclidean distance is 4, and the maximum number of selectable states is 14. In FIG. 5, each square mark indicates a state, and white or black color on the square mark indicates the polarity (negative or positive) of a recording code in each state.

In the case of this example, the start point state or the end point state of the code is selected correspondingly to the set partitioning method, and QCS has been removed entirely from the code word that satisfies the condition of the trellis diagram. In other words, TD that indicates the maximum bit length for summing the minimum Euclidean distance is finite, and is 33 bits in this case. In other words, the number of minimum bits of the path memory required for the code detector 16 is 33 bits.

As described above, the recording/reproducing apparatus 1 performs coding processing and decoding processing. In the coding processing, for example, the maximum sequential length Tmax is as relatively large as 9T, PLL is unstable, the SN ratio of the equalization signal is poor, and the cross talk from the adjacent track is serious as described above. These disadvantages are the problem in the coding processing.

Furthermore, in the decoding processing, for example, the maximum number of possible states in the ADS Nyquist diagram shown in FIG. 5 is as large as 14, and it is necessary to reduce the number for higher density recording. This disadvantage is the problem in decoding processing.

Furthermore, TD is 33 bits according to the ADS trellis diagram shown in FIG. 5, the path memory of 33 bits or more is needed, and the maximum number of selectable states is as large as 14. As the result, the apparatus (code detector 16) is inevitably large-sized, and the power consumption is large. These disadvantages are the problem.

Some characteristics in the case of 8/10 code of usual DC free code (code from which DC component is removed), which is practically used for DAT (digital audio tape recorder) that is one of digital audio system standards for consumer, DDS (digital data storage system) that is one of tape streamer standards, or AIT1 or the like, and in the case of 16/20 code (16/20 MSN code practically used in AIT2) used in this example are shown below:

| Coding rate | Tmax | Maximum number of states | Number of "01"/"10" sequence | TD | Detector gain |
| --- | --- | --- | --- | --- | --- |
| 8/10 | 4T | 2 | 14 | 14 | +3 dB |
| 16/20 | 9T | 14 | 9 | 33 | +6 dB |

The detector gain represents the theoretical gain to the white noise in the code detector in the case that the gain is 0 dB during bit-by-bit detection.

The number of "01"/"10" sequence is the maximum number of sequential "01" or "10" in the NRZ code, if the number is large, then "0" continues sequentially in the equalization signal, PLL becomes unstable, and it takes a long time to establish a path disadvantageously when the partial response equalization system, in which Nyquist frequency component of the transmission function becomes null, such as PR1 equalization, PR2 equalization, or PR4 equalization is applied. In other words, in this case, not only the maximum number of states Tmax but also the number of "01"/"10" sequence is desirably short. However, in the case of MSN code in which ADS is finite and the Nyquist frequency component of the code spectrum is null, the number of "01"/"10" sequence is not the problem because the number of "01"/"10" sequence is equal to or smaller than (ADS-1).

Though the data error rate during decoding can be improved by correcting the code detection error during decoding, the apparatus for performing such error correction is not disclosed, and the error correction cannot be therefore performed disadvantageously.

SUMMARY OF THE INVENTION

The present invention has been accomplished in view of the above problem, it is the object of the present invention to realize high-density recording of the signal and improvement of the data error rate during decoding with a simple structure.

According to one aspect of the present invention, a coding apparatus comprises generation means for generating the trellis code word from which the quasi-catastrophic sequence has been removed when the DC component and Nyquist frequency component of a code spectrum are removed together from an input data word and the maximum likelihood is detected, and modulation means for NRZI-modulating the above-mentioned trellis code word generated by the above-mentioned generation means.

It may be possible that the data word has 16 bits and the trellis code word has 20 bits.

It may be possible that the above-mentioned trellis code word generated by means of the above-mentioned generation means has 4 or less consecutive 0 from the head code of the above-mentioned trellis code word, 6 or less consecutive 0 in the intermediate of the above-mentioned trellis code word, and 3 or less consecutive 0 to the tail code of the above-mentioned trellis code word.

It may be possible that the above-mentioned one trellis code word is assigned to at least 1 or more above-mentioned data ward.

It may be possible that the above-mentioned generation means further comprises removing means for removing the above-mentioned quasi-catastrophic sequence.

It may be possible that the DC accumulation charge of the start point and the end point of the above-mentioned trellis code word generated by the above-mentioned generation means is −2 or +2, and the AC accumulation charge is 0.

It may be possible that the difference between the maximum value and the minimum value of the above-mentioned DC accumulation charge is equal to or greater than 10, and the difference between the maximum value and the minimum value of the above-mentioned AC accumulation charge is equal to or greater than 8.

It may be possible that the difference between the maximum value and the minimum value of the above-mentioned DC accumulation charge is equal to 10, and the difference between the maximum value and the minimum value of the above-mentioned AC accumulation charge is equal to 8.

According to another aspect of the present invention, a coding method comprises a generation step for generating the trellis code word from which the quasi-catastrophic sequence has been removed when the DC component and Nyquist frequency component of a code spectrum are removed together from an input data word and the maximum likelihood is detected, and a modulation step for NRZI-modulating the above-mentioned trellis code word generated in the above-mentioned generation step.

According to another aspect of the present invention, a recording medium storing a program for operating a computer to execute a processing includes a generation step for generating the trellis code word from which the quasi-catastrophic sequence has been removed when the DC component and Nyquist frequency component of a code spectrum are removed together from an input data word and the maximum likelihood is detected, and a modulation step for NRZI-modulating the above-mentioned trellis code word generated in the above-mentioned generation step.

According to another aspect of the present invention, in the coding apparatus, the coding method, and the recording medium, when the DC component and Nyquist frequency component of a code spectrum are both removed from an input data word and the maximum likelihood is detected, the trellis code word from which quasi-catastrophic sequence has been removed is generated, and the generated trellis code word is NRZI-modulated.

According to another aspect of the present invention, a decoding apparatus comprises decoding means for decoding the code word without referring to the tail code of the above-mentioned code word.

According to another aspect of the present invention, a decoding method includes a decoding step for decoding the code word without referring to the tail code of the above-mentioned code word.

According to another aspect of the present invention, a recording medium includes a decoding step for decoding the code word without referring to the tail code of the above-mentioned code word.

According to the present invention, in the decoding apparatus, the decoding method, and the recording medium, decoding is performed without referring to the tail code of the code word.

According to another aspect of the present invention, a decoding apparatus comprises decoding means for decoding the trellis code word without referring to the head code of the above-mentioned trellis code word when the above-mentioned trellis code word cannot take the start point at a plurality of states.

According to another aspect of the present invention, a decoding method comprises a decoding step for decoding the trellis code word without referring to the head code of the above-mentioned trellis code word when the above-mentioned trellis code word cannot take the start point at a plurality of states.

According to another aspect of the present invention, a recording medium includes a decoding step for decoding the trellis code word without referring to the head code of the above-mentioned trellis code word when the above-mentioned trellis code word cannot take the start point at a plurality of states.

According to the present invention, in the decoding apparatus, the decoding method, and the recording medium, decoding is performed without referring to the head code of the trellis code word when the trellis code word cannot take the start point at a plurality of states.

According to another aspect of the present invention, a recording medium records NRZI-modulated DC/Nyquist free code from which pseudo ruinous sequence has been removed by means of trellis removing method.

According to another aspect of the present invention, in the recording medium, DC/Nyquist free code from which the pseudo ruinous sequence has been removed by means of trellis removing method is NRZI-modulated and recorded.

BRIEF DESCRIPTION OF THE DRAWINGS

FIG. 12 is a diagram for showing the number of code words generated by coding the code length of 40 bits or smaller.

FIG. 13 is a diagram for showing exemplary code words assigned to data words.

FIG. 15 is a diagram for showing RDS* and ADS* of each state shown in the finite state transition diagram of FIG. 14.

DESCRIPTION OF THE PREFERRED EMBODIEMNTS

Figure 1:
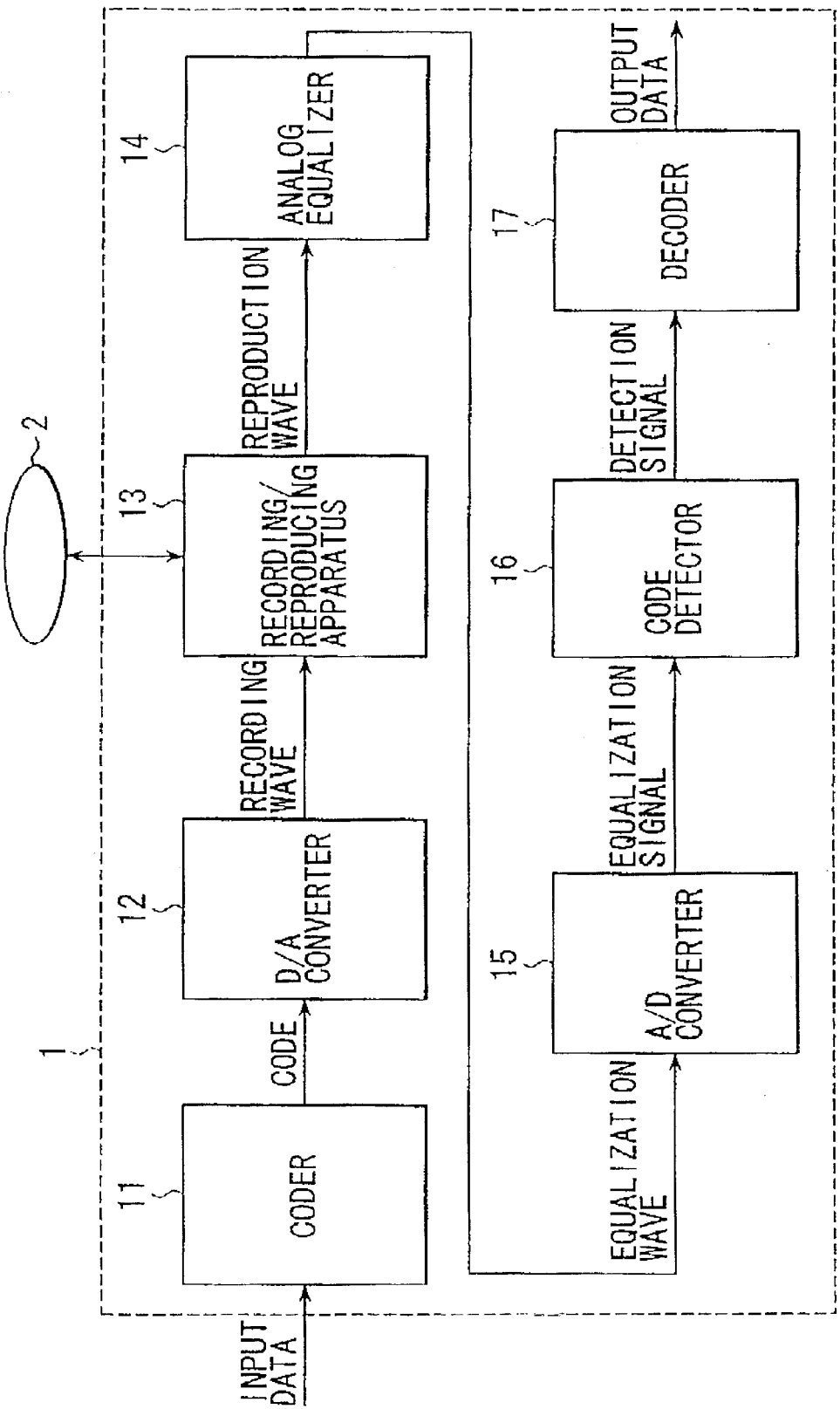
FIG. 1 is a block diagram for illustrating an exemplary structure of a conventional recording/reproducing apparatus 1.
Figure 2:
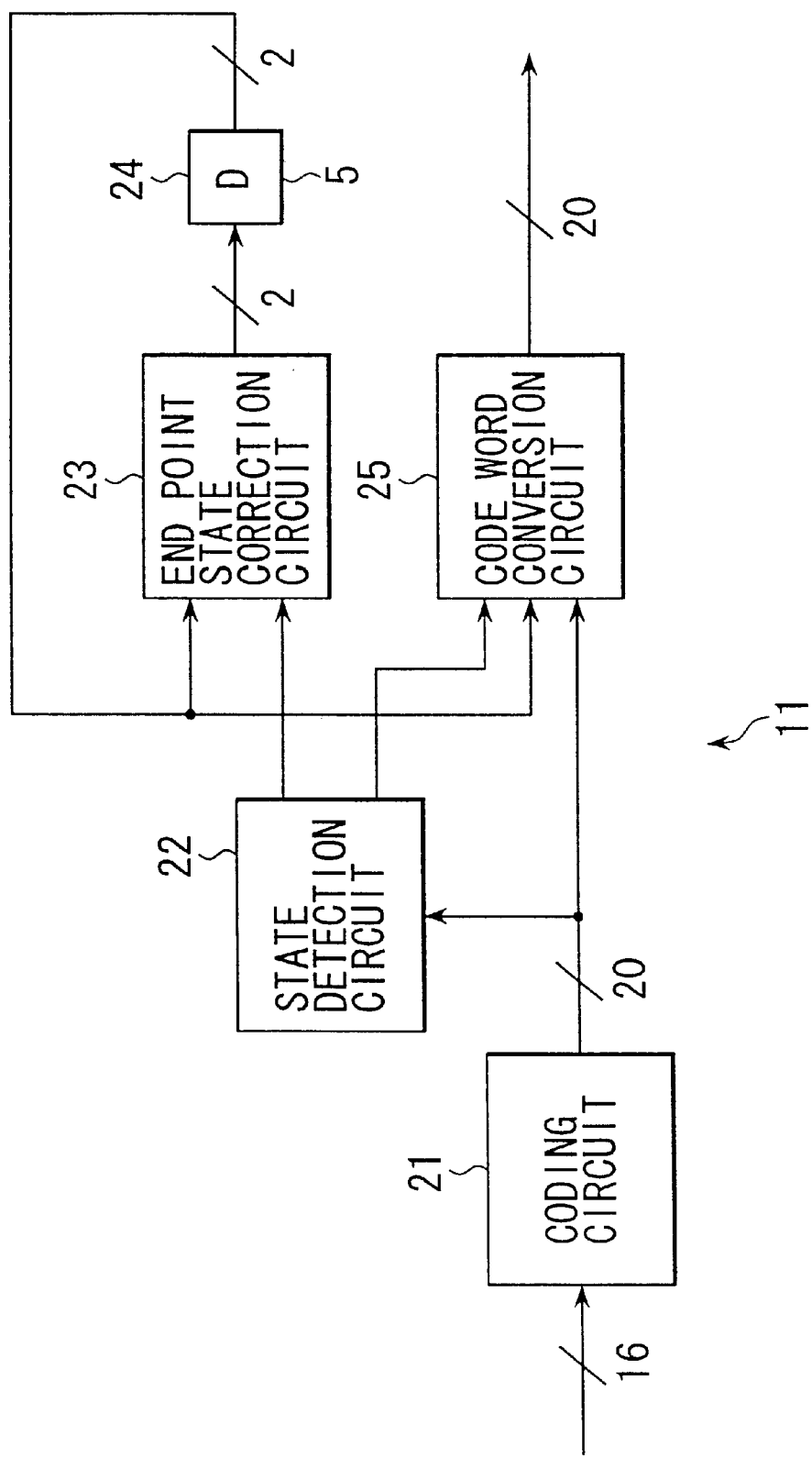
FIG. 2 is a block diagram for illustrating an exemplary structure of a coder 11 shown in FIG. 1.
Figure 6:
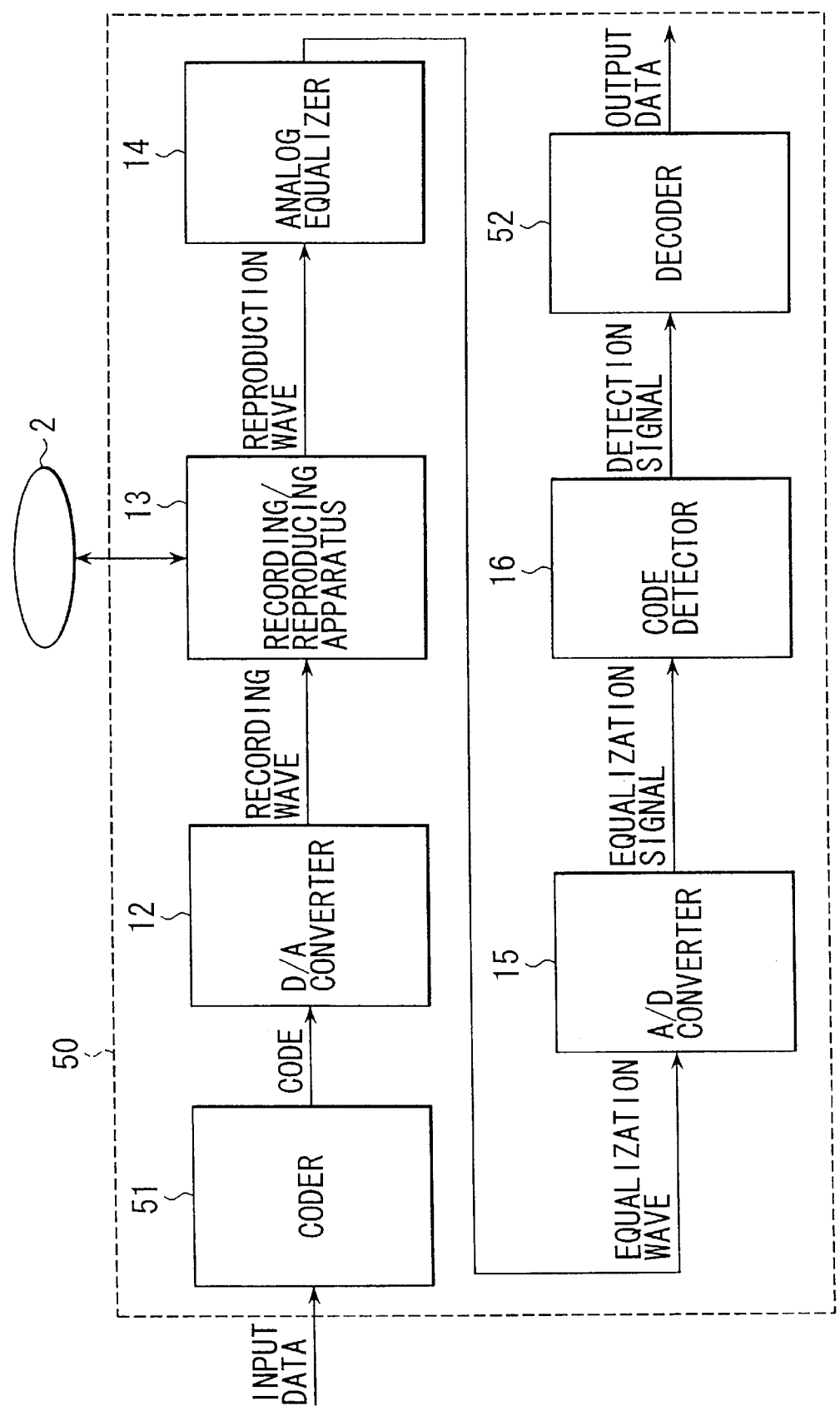
FIG. 6 is a block diagram for illustrating an exemplary structure of a recording/reproducing apparatus 50 to which the present invention is applied.

FIG. 6 shows an exemplary structure of a recording/reproducing apparatus 50 to which the present invention is applied. The same components shown in FIG. 6 as those shown in FIG. 1 are given the same characters, and the description is omitted hereinafter. A 16-bit data word is supplied to a coder 51. The coder 51 converts (codes) the input 16 bit data word to the code word having a code length of 20 bits based on the finite state transition diagram shown in FIG. 8 that will be described hereinafter, and supplies it to the D/A converter 12. In the case of the present example, the code word supplied from the coder 51 is subjected to NRZI (non-return to zero on one) modulation (modulation in which bit of the recording (transfer) waveform is inverted when the bit of the code word is 1) so as to be converted to the recording short waveform, and supplies it to the recording/reproducing apparatus 13.

Figure 7:
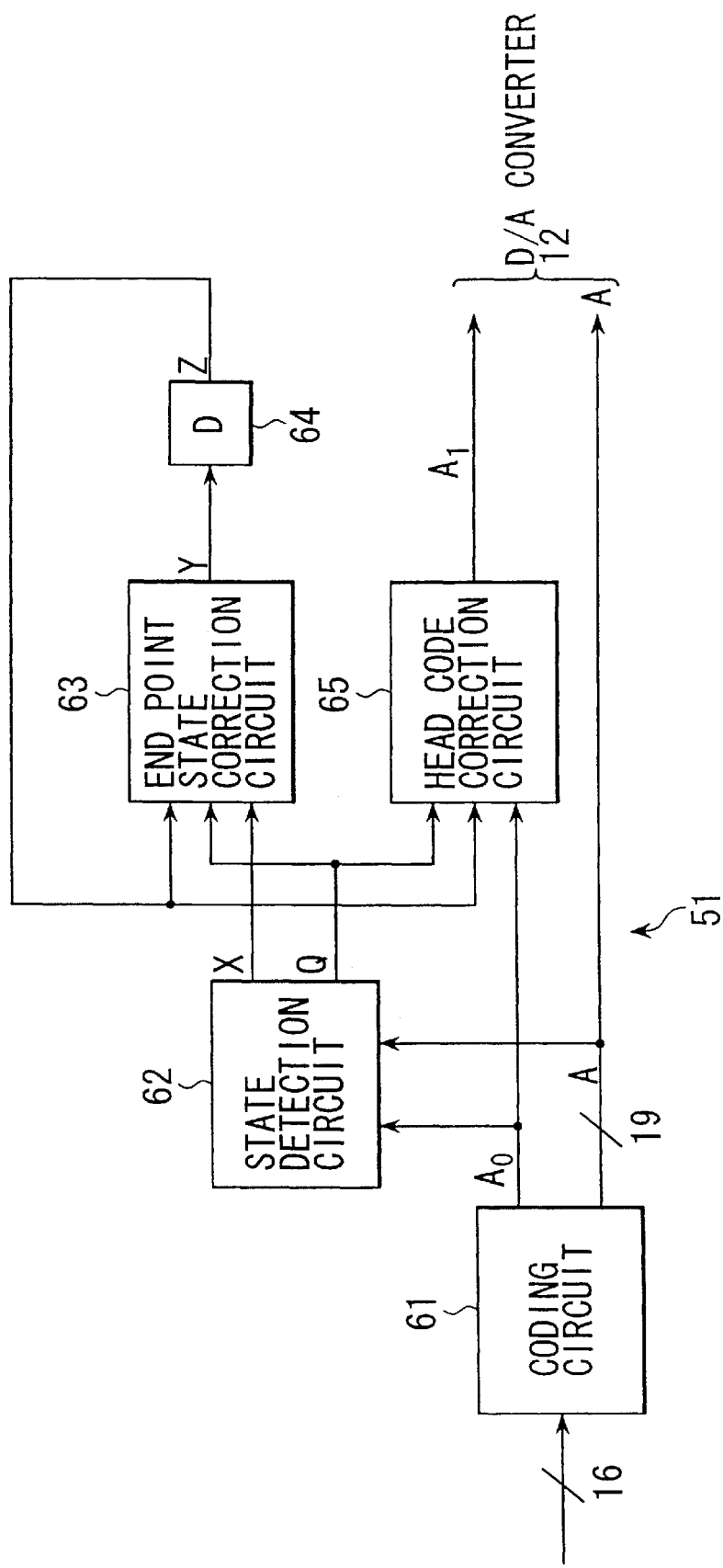
FIG. 7 is a block diagram for illustrating an exemplary structure of a coder 51 shown in FIG. 6.
Figures 8, 9:
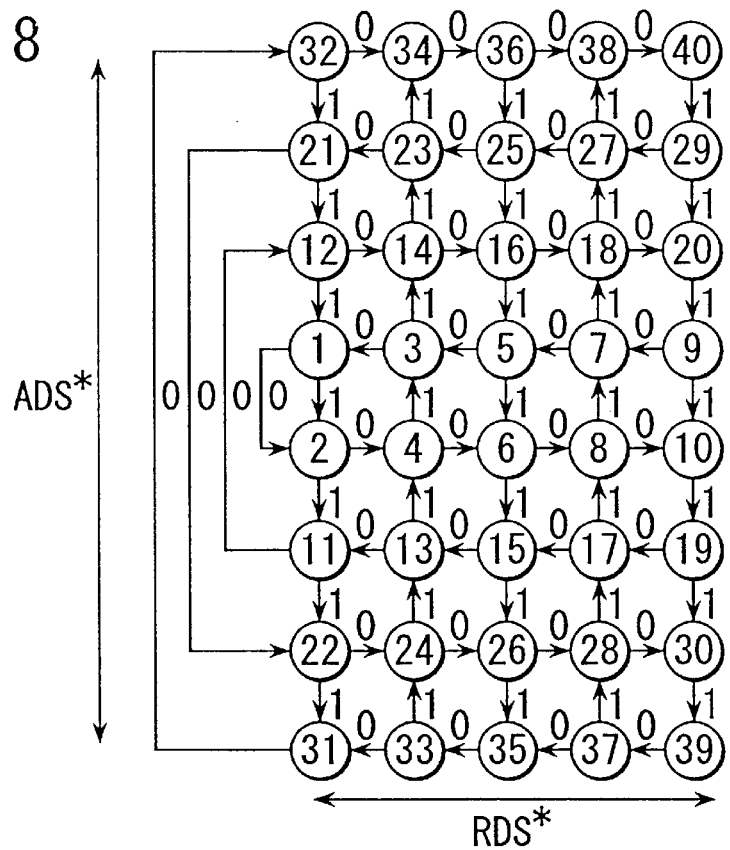
FIG. 8 is another finite state transition diagram.
FIG. 9 is a diagram for illustrating RDS* and ADS* of each state shown in the finite state transition diagram of FIG. 8.

FIG. 7 shows an exemplary structure of the coder 51. A coding circuit 61 is structured based on the finite state transition diagram that represents the restriction on ADS and RDS as shown in FIG. 8, converts the input 16 bit data word to the code word having a code length of 20 bits, and supplies the head 1 bit (head code) of the converted 20 bit code word to a state detection circuit 62 and a head code correction circuit 65 as the head temporary code A0. Also, the coding circuit 61 supplies the 19 bit code A having no head code out of the converted 20 bit code word to the state detection circuit 62 and the D/A converter 12.

The code word to be coded by means of the coding circuit 61 satisfies the four restrictions from the first to fourth restrictions described below.

The first restriction is "RDS ranges from −5 to +5, that is, DSV is 10, and ADS ranges from −4 to +4, that is, ADSV is 10."

The second restriction is "RDS axis and ADS axis of the finite state transition diagram shown in FIG. 8 is converted respectively to the axes corresponding to RDS* (=RDS×p) and ADS* (=ADS×p) that are obtained by multiplying RDS and ADS by the code polarity p (p is +1 or −1) after NRZI modulation."

The third restriction is "the state of the start point and the state of the end point should be state 4 or state 5 in the finite state transition diagram shown in FIG. 8." Each state in the finite state transition diagram shown in FIG. 8 is given a state number.

The fourth restriction is "the number of consecutive "0" from the head of the code word is equal to or smaller than 4, the number of consecutive "0" in the intermediate of the code word is equal to or smaller than 6, and the number of consecutive "0" to the end point of the code word is equal to or smaller than 3."

The first restriction is described below. To satisfy the first restriction, the code word is generated based on the finite state transition diagram (FIG. 8) having a finite DSV value and a finite ADSV value (the code word is generated with selection of a path from among paths (sequential state transition) comprising 20 times state transition based on the finite state transition diagram shown in FIG. 8). Thereby, DC component and Nyquist frequency component of the code spectrum are removed from the code word. In other words, by applying the first restriction, DC component and Nyquist frequency component are removed from the code word and the code word is converted to the DC/Nyquist free code. In other words, MSN code is applied in the present example.

Next, the second restriction is described below. In the finite state transition diagram shown in FIG. 8, DSV and ADSV are both finite value correspondingly to the first restriction, and the RDS axis and the ADS axis are converted respectively to the axes corresponding to RDS* and ADS* formed by multiplying the code polarity p after NRZI modulation according to the second restriction. In detail, the existing 40 states are determined depending on RDS* and ADS*. By applying the second restriction, the finite state transition diagram (FIG. 8) having a regular structure in which each state is determined by RDS* and ADS* is generated.

"0" or "1" generated from each state in the finite state transition diagram indicates a NRZI code output because the code word is subjected to NRZI modulation in the D/A converter 12. Therefore, the finite state transition diagram is structured on the premise of NRZI modulation. In FIG. 8, a circle (○) indicates each state, and a number written in each circle indicates the state number.

Also, by determining the state by use of a value classified depending on the code polarity p (positive or negative) for RDS and ADS, the finite state transition diagram structured on a premise of NRZI modulation can be formed. However, in this case, the structure of this finite state transition diagram is very complex in comparison with the finite state transition structure shown in FIG. 8.

Next, the fourth restriction is described below. In the finite state transition diagram shown in FIG. 8, there are 71949 code word that satisfy the third restriction, namely the code words having the start point state and the end point state of state 4 or state 5, and if arbitrary 65536 ($=2^{16}$) code words are selected from these code words as they are and assigned to the data word in coding, then the maximum consecutive length Tmax is 10T. To avoid such problem, code words that satisfy the fourth restriction are selected and then arbitrary 65536 ($=2^{16}$) code words are further selected from among the selected code words (in this example, 65732 code words), and these code words are assigned to the data word, as the result in this case the maximum consecutive length Tmax is 7T. In other words, by applying the fourth restriction, the maximum consecutive length Tmax of 7T is obtained.

As described hereinbefore, the restrictions are applied.

Figures 10, 11:
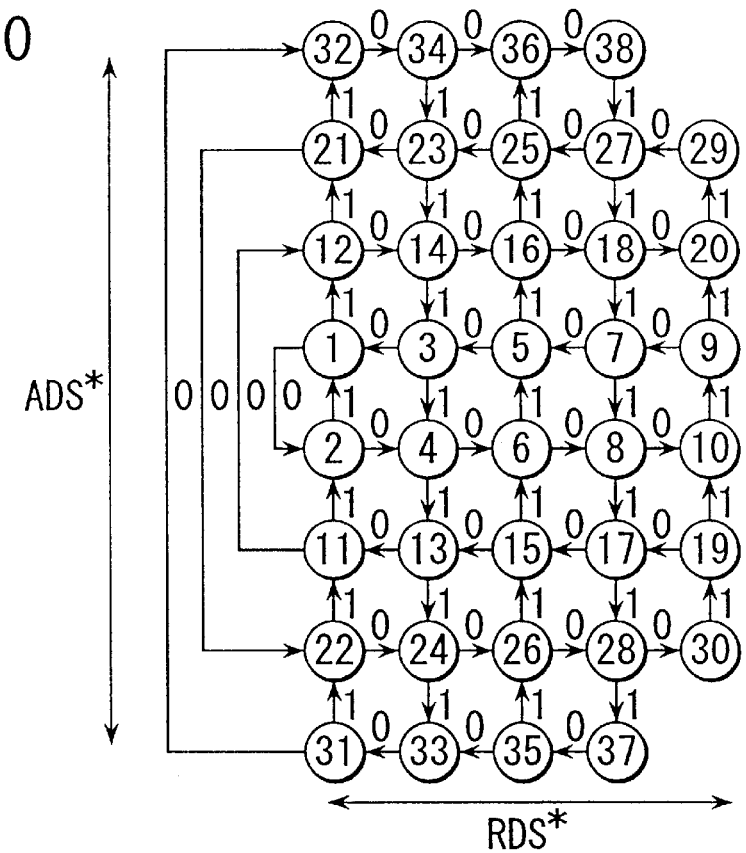
FIG. 10 is another finite state transition diagram.
FIG. 11 is a diagram for illustrating RDS* and ADS* of each state shown in the finite state transition diagram of FIG. 10.

Aside from the above, in the finite state transition diagram shown in FIG. 8, the difference between RDS* and ADS* is even number (including 0) (RDS* and ADS* are both odd number or even number) as shown in FIG. 9, which shows RDS* and ADS* values corresponding to the state number of each state, and Shannon capacity is 0.8733. On the other hand, as the finite state transition diagram shown in FIG. 10, RDS* and ADS* values may be arranged so that the difference between RDS* and ADS* is the odd number (any one of RDS* and ADS* is an even number and the other one of RDS* and ADS* is an even number) as shown FIG. 11. However, in this case, Shannon capacity is 0.8721, and smaller than that of the finite state transition diagram shown in FIG. 8. In other words, the number of code words to be formed is smaller than that of the case in which the finite state transition diagram shown in FIG. 8 is used (though the number of code words could be larger depending on the state of the start point and the state of end point of the code word, it is anyway rare case). In view of the above, in the case of the present example, the coding circuit 61 is structured not based on the finite state transition diagram shown in FIG. 10 (the finite state transition diagram in which the difference between RDS* and ADS* is the odd number), but based on the finite state transition diagram shown in FIG. 8 (the finite state transition diagram in which the difference between RDS* and ADS* is the even number).

The number of code words having the start point and the end point at the state 4 (RDS*=+2, ADS*=0) and the state 5 (RDS*=−2, ADS*=0 from FIG. 9) out of the code words having the code length of 40 bits or less generated by means of coding processing is shown in FIG. 12. Because the codes in which RDS and ADS are both restricted return usually to the original state in units of 4 bits, the code words shown in FIG. 12 is classified in units of 4 bits, and the number of code words are shown for each classification.

As shown in FIG. 12, though 30/36 coding rate is the highest of 0.833 for coding of the code length of 40 bits or less, for example, because arithmetic processing in a computer or the like is performed usually in units of a byte (8 bits), the code length is desirably a multiple of 8 for simplification of the coder 51 circuit and for reducing the error transmission. In the present example, the coding circuit 61 executes 16/20 coding, which exhibits the highest coding rate, out of coding which involves the code length of a multiple of 8.

The description returns to FIG. 7. The coding circuit 61 comprises a logic circuit, PLA (programmable logic array), or series circuit of code word number subtracter as shown in Japanese Patent Application No. Hei 10-281086. The coding circuit 61 comprises a series circuit of code word number subtracter as disclosed in Japanese Patent Application No. Hei 10-281086, in the case that the data word is as large as 16 bits as in the case of the present example, the structure of the coding circuit 61 can be thereby simplified.

The state detection circuit 62 detects the temporary state X of the end point of the code word based on the head temporary code A0 and 19 bit code A supplied from the coding circuit 61, and supplies it to an end point state correction circuit 63. Furthermore, the state detection circuit 62 determines whether the code word supplied from the coding circuit 61 is the code word (duplicate code word) that can take a plurality of states (in the present example, the state 4 and the state 5) or not, and supplies the duplicate code word detection parity Q corresponding to the determination result to the end point state correction circuit 63 and the head code correction circuit 65. The code word that is not the duplicate code word is referred to as non-duplicate code word hereinafter.

In the present example, there are 71949 code words that can take the start point state and the end point state at the state 4 or state 5 respectively. All the code words having the start point at the state 4 can be converted to the code words having the stat point at the state 5 by converting the head code "0" to "1" or the head code "1" to "0" (the conversion is referred to as inversion operation hereinafter). To the contrary, the inversion operation of the head code of the code word having the start point at the state 5 results in the code word having the start point at the state 4. Therefore, the code word that can take the start point at the state 4 and the code word that can take the start point at the state 5 are in total inversion code relation after NRZI modulation.

When the head code of the code word that can take the start point at the state 4 (or the state 5) is subjected to inversion operation, it is converted not only to the code word that can take the start point at the state 5 (or the state 4), but also to other code word having the start point at the state 4(or the state 5) in some cases. The 71949 code words that can take the start point at the state 4 and the 71949 code words that can take the start point at the state 5 overlap partially each other, and 27126 code words can take the start point both at the state 4 and the state 5. The code word A and the code word B shown below are included in such exemplary duplicate code word.

The code word A 00010000010000010001
The code word B 10010000010000010001

For example, the head code "0" of the code word A is inverted to "1" to result in the code word B, and the converse is also true. However, because these code words are duplicate code words that can take the start point at the state 4 and the state 5, the code words are assigned to one data word respectively. On the other hand, when residual 44823 (=71949−27126) code words are used, it is necessary to assign at least two code words to one data word.

The state detection circuit 62 comprises an up-down counter that counts RDS (or RDS*) in bit units or a conversion circuit that operates in units of several bits based on the finite state transition diagram as disclosed in Japanese Patent Application No. Hei 10-118651. By structuring the state detection circuit 62 with the conversion circuit disclosed in Japanese Patent Application No. Hei 10-118651, the structure can be simplified.

The end point state correction circuit 63 receives the temporary state X of the end point supplied from the state detection circuit 62, the duplicate code word detection parity Q, and the state Z of the end point of the code word that has been coded last time supplied from the register 64. The end point state correction circuit 63 determines the state Y of the end point of the code word that is to be coded this time based on the temporary state X of the input end point and the state Z of the end point of the code word that has been coded last time, and supplies it to the register 64.

The register 64 holds the state Y supplied from the end point state correction circuit 63 and supplies the held state Y to the end state correction circuit 63 and the head code correction circuit 65 as the state Z of the end point of the code word that has been coded last time.

The head code correction circuit 65 calculates the head code A1 based on the head temporary code A0 supplied from the coding circuit 61, the duplicate code word detection parity Q supplied from the state detection circuit 62, and the state Z (the state of the end point) supplied from the register 64, and supplies it to the D/A converter 12.

Next, the operation of the coder 51 will be described below. When the 16 bit data word is supplied to the coding circuit 61, the coding circuit 61 fixes any one of the state 4 or the state 5 as the start point, and converts the input 16 bit data word to the 20 bit code word.

In the case of the present example, as described above, there are 71949 code words that can take the start point at the state 4 and 71949 code words that can take the start point at the state 5 among the code words that satisfy the third restriction, and out of both code words, there are 27126 duplicate code words that can take the start point both at the state 4 and the state 5. Because these duplicate code words can be discriminated, the duplicate code words are assigned to data words in one-to-one relation.

On the other hand, because 44823 (=71949−27126) code words that can take the start point only at the state 4 and 44823 (=71949−27126) code words that can take the start point only at the state 5 are different each other, two code words, namely a code word that can take start point at only the state 4 and a code word that can take the start point only at the state 5 corresponding to each other are assigned to one data word. Since only first bits of these code words are different, however, it is proper for the coding circuit 61 to assign a code word that can take a start point at only either of the state 4 or state 5 to a data word.

In other words, the coding circuit 61 assigns arbitrary one of the 65536 (=$2^{16}$) code words selected from among 65732 code words that satisfy the first to fourth restrictions to the input data word.

Because the code word is coded so that the code word that includes the fourth restriction is assigned to the data word, the maximum consecutive length Tmax of the code word that is to be converted by means of the coding circuit 61 is 7T. FIG. 13 shows code words assigned to 32 data words in the order from the smallest in one-to-one relation out of the code words selected when the state 5 is fixed as the start point and coded. In FIG. 13, the data word and the code word are represented by means of binary number system.

If the maximum consecutive length Tmax is 6T, the sufficiently necessary code word is not obtained. Therefore, the maximum consecutive length Tmax cannot be equal to 6T or smaller.

There are totally 167 code words that possibly generate consecutive 7T, namely binary number "100000010000001" (including the code word connection point) out of 65732 code words that satisfy the above-mentioned fourth restriction, and by using 65565 code words from which all these possible words are removed, the arbitrary code word that includes consecutive 7T can be used as a sync signal in the 16/20 code of the present embodiment.

As described above, the coding circuit 61 converts the input 16 bit data word to the 20 bit code word, and then supplies the head code (1 bit) of the converted code word to the state detection circuit 62 and the head code correction circuit 65 as the head temporary code A0, and supplies the 19 bit code A (the code excluding the head code) to the state detection circuit 62 and the D/A converter 12.

When the head temporary code A0 and the 19 bit code A are supplied from the coding circuit 61, the state detection circuit 62 determines the ADS* and RDS* up to the tail code (bit) of the 16 bit code A, and supplies the ADS* and RDS* that are determined at the last determination to the end point state correction circuit 63 as the temporary state X of the end point of the code word.

The state detection circuit 62 determines whether the code word supplied from the coding circuit 61 is a duplicate code word or not, and supplies a duplicate code word detection parity Q that indicates the determination result to the end point state correction circuit 63 and the head code correction circuit 65.

In detail, because the duplicate code word involves the difference between the maximum value and the minimum value of RDS (or RDS*) (maximum value and minimum value) in the code word when the RTS (or RDS*) of the state of the start point is "0", namely C-DSV (code word digital sum variation) of 6 or smaller, whether the code word supplied from the coding circuit 61 is a duplicate code word or not is determined by determining whether the C-DSV is a number that is equal to or smaller than 6 or not. In the case of the DC/Nyquist free code in which RDS and ADS of the code word are both restricted as in the case of the present example, it is estimated to be necessary that RDS and ADS* (RDS and ADS) of the end point of the code word are both to be checked in order to determine whether the code word is a duplicate code word or not. However, in the case of the present example, because the ADS* of the end point of a duplicate code word is always "0", it is possible to determine whether the code word is a duplicate code word or not by checking C-DSV of only RDS* as described above.

The state detection circuit 62 calculates RDS (or RDS*) of the code word not only when the state of the end point of the code word is detected but also when whether the input code word is a duplicate code word or not is determined as described above. In other words, the structure (circuit) for calculating RDS (or RDS*) is commonly used when both processing is performed.

The end point state correction circuit 63 receives the temporary state X of the end point supplied from the state detection circuit 62, the duplicate code word detection parity Q, and the state Z of the end point of the code word coded last time supplied from the register 64. The end point state correction circuit 63 compares the temporary state X of the end point supplied from the state detection circuit 62 with the state Z of the end point of the code word coded last time that is stored in the register 64. If the both inputs are different from each other and the duplicate code word detection parity Q outputted from the state detection circuit 62 indicates that a duplicate code word is supplied, then the end point state correction circuit 63 replaces the temporary state X of the end point supplied from the state detection circuit 62 (replace with the state 5 if the temporary state X is the state 4, or replace with the state 4 if the temporary state X is the state 5), and supplies it to the register 64. The register 64 holds it.

Because the end point is corrected based on the temporary state X of the end point of the code word detected by means of the state detection circuit 62 and the state Z of the end point of the code word coded last time, the duplicate code word is assigned to the data word in one-to-one relation.

The head code correction circuit 65 receives the head temporary code A0 supplied from the coding circuit 61, the duplicate code word detection parity Q supplied from the state detection circuit 62, and the state Z of the end point of the code word coded last time that has been supplied from the register 64. The head code correction circuit 65 compares the head temporary code A0 supplied from the coding circuit 61 with the state Z supplied from the register 64 (the state of the end point of the code word coded last time). If the state of the start point assumed based on the head temporary code A0 is different from the state Z and if the duplicate code word detection parity Q that indicates the determination result that the code word is non-duplicate code word is supplied from the state detection circuit 62, the head code correction circuit 65 inverts the head temporary code A0 supplied from the coding circuit 61 and supplies it to D/A converter 12.

On the other hand, if the state of the start point assumed based on the head temporary code A0 is identical with the state Z or if the duplicate code word detection parity Q outputted from the state detection circuit 62 indicates that a duplicate code word is supplied, the head code correction circuit 65 supplies the head temporary code A0 supplied from the coding circuit 61 to the D/A converter 12 as it is. In other words, the code word converted by means of the coding circuit 61 is supplied to the D/A converter 12 as it is.

As described above, because the head of the non-duplicate code word is inverted if the assumed state of the start point of the non-duplicate code word is different from the end point of the code word coded last time, the coding circuit 61 performs coding in which the state of the start point is any one of the state 4 and the state 5. Thereby, the structure of the coding circuit 61 can be simplified.

Next, the difference between coding based on the finite state transition diagram on the premise of NRZ modulation shown in FIG. 14 and coding based on the finite state transition diagram (FIG. 8) on the premise of NRZI modulation described above will be described below.

Figure 14:
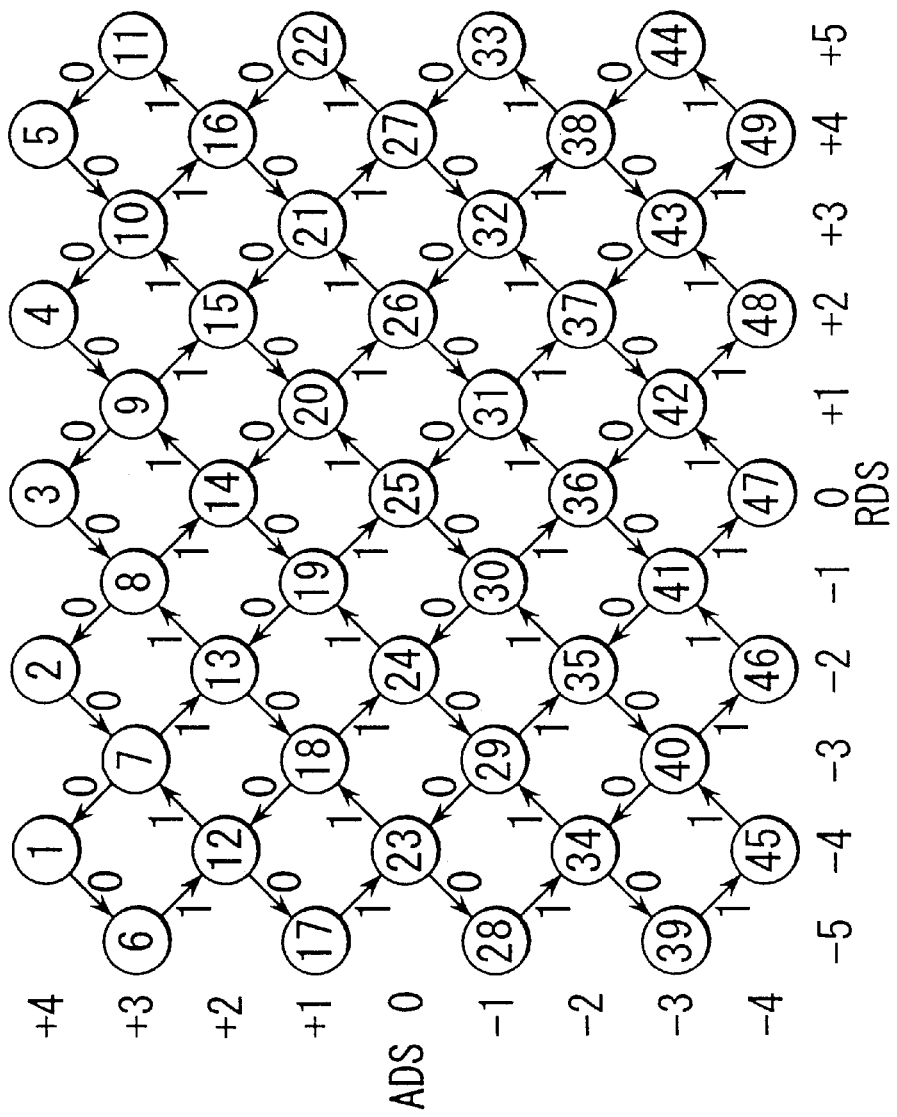
FIG. 14 is another finite state transition diagram.

In the finite state transition diagram shown in FIG. 14, RDS ranges from −5 to +5, that is, DSV is 10, and ADS ranges from −4 to +4, that is, ADSV is 8, and there are 49 states. Because this finite state transition diagram is based on NRZ modulation premise, "0" or "1" generated from each state indicates NRZ code output. Shannon capacity is 0.8733 as same as that shown in FIG. 8. The value of RDS and ADS corresponding to the state number of each state is shown in FIG. 15.

In this finite state transition diagram, there are 71949 code words of 20 bits that can take the start point and the end point of the code word at the state 26 (RDS=+2 and ADS=0) or the state 24 (RDS=−2 and ADS=0), and these code words are in total inversion relation each other. Furthermore, 27126 code words out of code words that can take the start point at the state 24 or the state 26 are duplicate code words that can take the start point both at the state 24 and the state 26.

Usually, management of the polarity of all the reproduction signals in individual recording/reproducing apparatus is not performed because it involves the troublesome work, in the case that the code based on the NRZ modulation premise is used, if the polarity of the code word is inverted when the signal is reproduced, two types of code words that are in the total inversion relation are assigned to one data word so that the same data word is decoded. Therefore, for example, in the case that NRZ modulation is employed as a premise though the duplicate code word is involved, it is necessary to assign two types of duplicate code words that are in total inversion code relation to one data word.

Code word C and code word D are exemplary code words of such duplicate code word.

Code word C: 00011111100000111110

Code word D: 11100000011111100001

These code word C and code word D are equivalent to the code words that are generated by NRZI modulation of the above-mentioned code word A or code word B, and are two code words that can take the start point both at the state 24 and the state 26 and that are in total inversion code relation. However, in the case of NRZ modulation, to discriminate the data word when the data is decoded, it is necessary to assign these two code words to one data word. Therefore, after all, the number of data words to which the code word is assigned is 58386 (=71949−27126÷2), and less than 65536 (=$2^{16}$) that is the total number of input data words. In other words, when the finite state transition diagram shown in FIG. 14 (the finite state transition diagram structured on the NRZ modulation premise) is satisfied, 16/20 coding in which DSV is 10 and ADSV is 8, RDS of the state of the start point and the end point of the code word is +2 or −2, and ADS is 0 is not performed though it is performed in the present invention.

Figure 16:
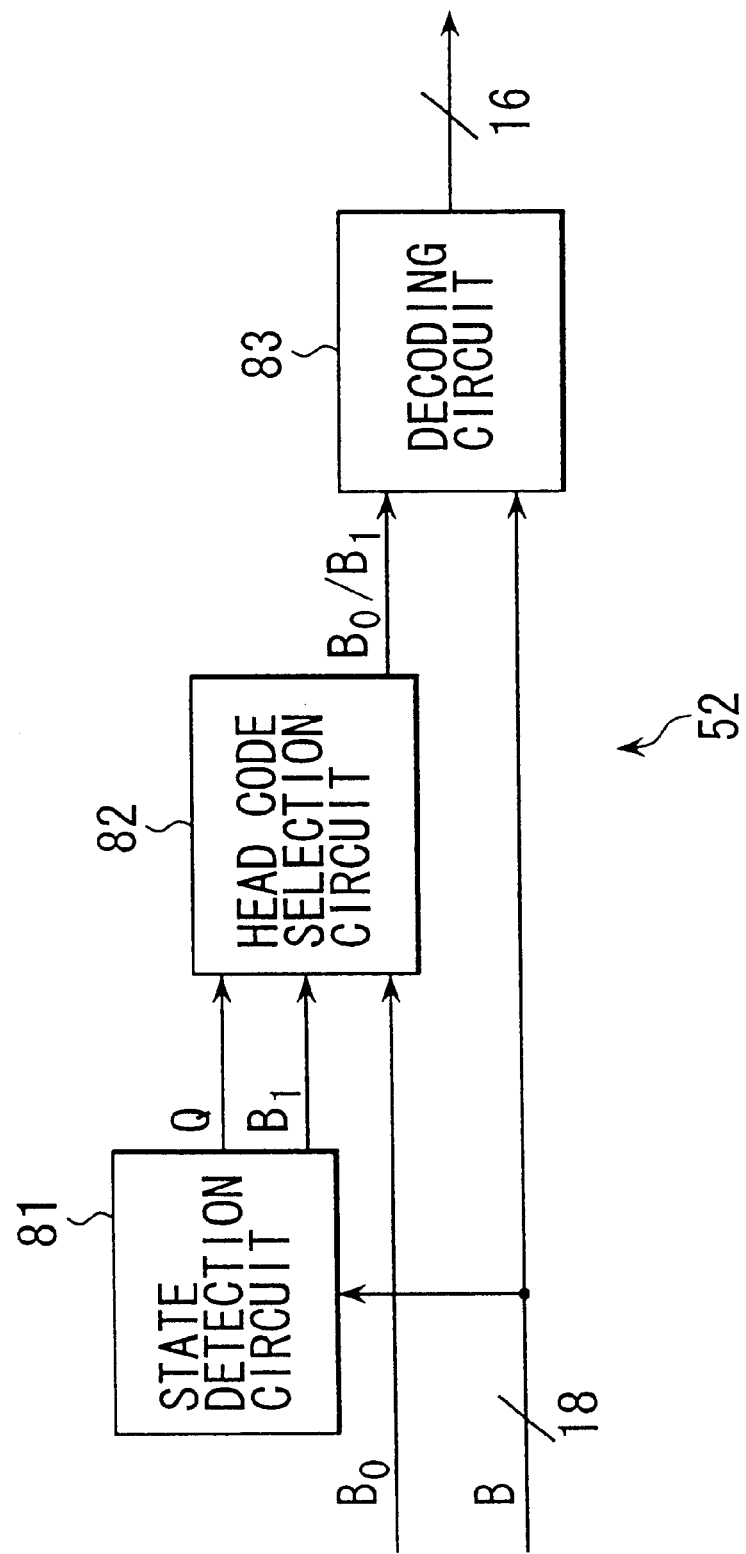
FIG. 16 is a block diagram for illustrating an exemplary structure of a decoder 52 shown in FIG. 6.

FIG. 16 shows an exemplary structure of a decoder 52. A state detection circuit 81 receives 18 bit codes B that are code words detected by means of the code detector 16 from which the head code B0 (1 bit) and tail code (1 bit) have been removed.

The state detection circuit 81 determines whether the code word supplied from the decoder 52 is a duplicate code word or not by checking whether C-DSV of the RDS* of the code word is equal to or smaller than 6 or not as in the case of the state detection circuit 62 shown in FIG. 7, and supplies the duplicate code word detection parity Q that indicates the determination result to a head code selection circuit 82.

Because the state detection circuit 81, unlike the state detection circuit 62 shown in FIG. 7, does not detect the state of the end point of the code word, the tail code of the code word is not supplied to the state detection circuit 81.

Also the head code B0 is not supplied to the state detection circuit 81. The reason will be described below. In the case of the finite state transition diagram shown in FIG. 8, when any one of "0" and "1" is generated while RDS*=0, the state moves to the state of RDS*=+1 (transit) in the next transition. Thereby, the state detection circuit 81 converts RDS* of the second bit code to "+1" previously, that is, determines C-DSV of RDS* on the assumption that RDS* of the state of the start point of the code word is "0" and determines whether it is equal to or smaller than 6 or not, and if C-DSV is equal to or smaller than 6, then the code word is determined to be a duplicate code word, on the other hand if C-DSV is larger than 6, then the code word is determined to be a non-duplicate code word. Because the head code B0 is not used in the determination to determine whether the code word is a duplicate code word or not as described above, the head code B0 is not supplied to the state detection circuit 81.

If the code word supplied to the decoder 52 is determined to be a non-duplicate code word, the state detection circuit 81 estimates the head code, and supplies the estimated head code to the head code selection circuit 82 as the head temporary code B1. In detail, the state detection circuit 81 fixes (assume) the head temporary code B1 to any one of "0" and "1", and determines whether the code word satisfies the first restriction or not (for example, whether DSV=10 or not), and if the code word satisfies the first restriction, then the assumed value is set as the head temporary code B1, on the other hand if the code word does not satisfy the first restriction, then the value that is the other value than the assumed value is set as the head temporary code B1, and supplies the value to the head code selection circuit 82.

In the case of DC/Nyquist free code in which DSV and ADSV are both restricted as in the case of the present example, it is likely necessary to examine the restriction rule of DSV and ADSV. However, because ADS* is no other than but "0" at the state of the start point and the end point, it is possible to estimate the head temporary code B1 as described above by determining whether the restriction regulation (DSV=10) of only RSV* (RDS) is satisfied or not.

The state detection circuit 81 comprises an up-down counter that counts RDS (or RDS*) in bit units or a conversion circuit that operates in units of several bits based on the state transition diagram as disclosed in Japanese Patent Application No. Hei 10-118651. The state detection circuit 81 can be simplified the more by structuring it with a conversion circuit as disclosed in Japanese Patent Application No. Hei 10-118651.

The head code selection circuit 82 receives the duplicate code word detection parity Q and the head temporary code B1 from the state detection circuit 81 and the head code B0 of the code word that has been supplied to the decoder 52 from the code detector 16. Upon receiving the duplicate code word detection parity Q indicating that the code word is determined to be a non-duplicate code word, the head code selection circuit 82 selects the head temporary code B1 supplied from the state detection circuit 81 at the timing, and supplies it to the decoding circuit 83. On the other hand, upon receiving the duplicate code word detection parity Q indicating that the code word is determined to be a duplicate code word, the head code selection circuit 82 selects the head code B0 supplied from the code detection apparatus at the timing, and supplies it to the decoding circuit 83.

The decoding circuit 83 receives the head code B0 or the head temporary code B1 from the head code selection circuit 82, and receives 18 bit code B having no head code B0 and no tail code from the code detection apparatus 16. The decoding circuit 83 generates 16 bit data word based on the input 18 bit code B and the head code B0 or the head temporary code B1 supplied from the head code selection circuit 82, and supplies it to the external apparatus.

The decoding circuit 83 comprises a logic circuit, PLA, or a series circuit of code word number adder as disclosed in Japanese Patent Application No. Hei 10-281086. The circuit structure of the decoding circuit 83 can be simplified the more by structuring the decoding circuit 83 with a series circuit of code word number adder disclosed in Japanese Patent Application No. Hei 10-281086.

As described above, because the head code selection circuit 82 selects the head code based on the duplicate code word detection parity Q supplied from the state detection circuit 81, the state of the start point of the code word supplied to the decoding circuit 83 is fixed to a single state.

If the decoding circuit 83 is structured so as to decode also the code word having the start point at the different state, the state detection circuit 81 and the head code selection circuit 82 can be omitted, and the head code B0 is supplied directly to the decoding circuit 83.

Aside from the above, the head code selection circuit 82 selects the head code not based on the content of the head code B0 of the code word. In other words, this fact means that selection error (detection error) of the head code in the head code selection circuit 82 is not reflected on the data error in decoding. For example, in the case that all the 27126 duplicate code words out of 65536 code words are assigned to the data word, the head code error of 58.6 (=100×(1−27126/65536))% to the total is corrected if the generation probability is equal for all the data words. If 18 bit code excepting the head code and tail code is erroneous, the error possibly propagates to the head code. However, in this case, because the code word itself is erroneous, the propagation is not problematic.

In other words, in the present invention, the head bit of the code word is not referred in the decoder method for decoding the duplicate code word that can take the start point at a plurality of states to the data word.

If there is no duplicate code word, the number of code words to be assigned to the data word is the same number as that in the case of NRZ modulation. However, the code word is generated by inverting all the head codes of the codes having the start point at the different state. Thereby, the probability that the detection error of the head code is corrected in decoding will range from 58.6% to 100%.

Figure 17:
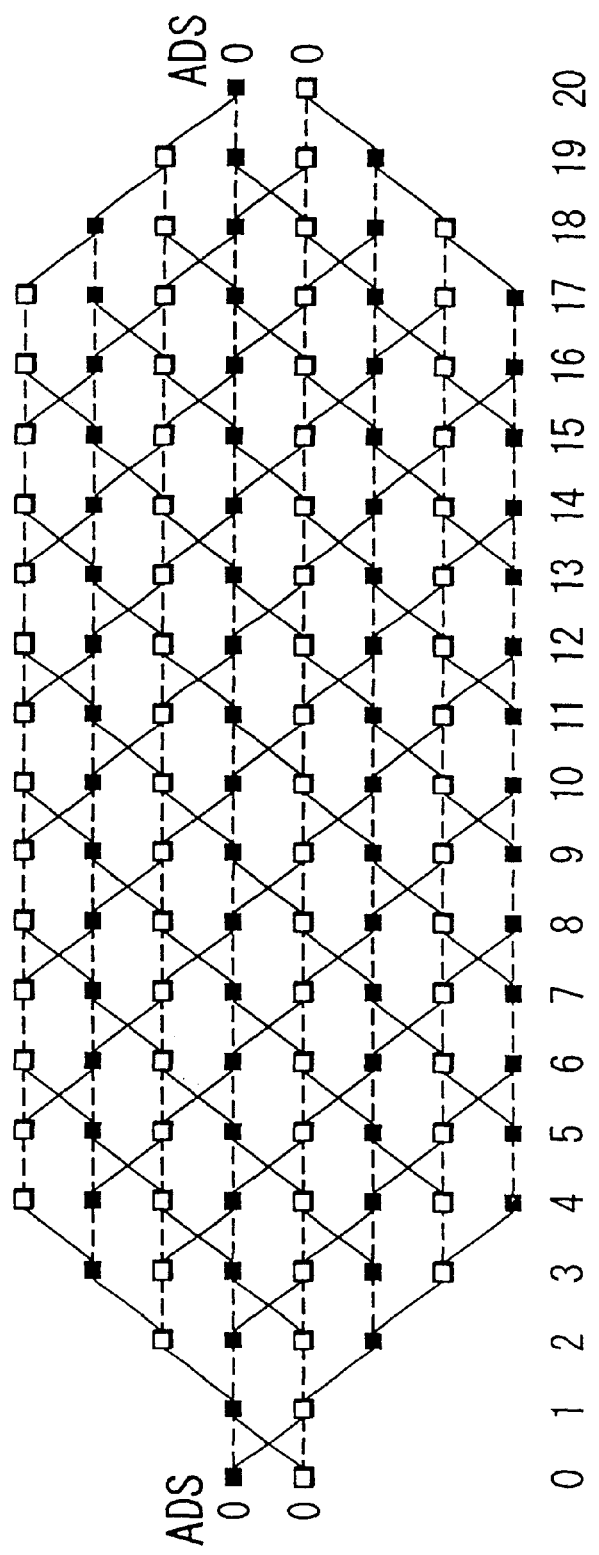
FIG. 17 is another trellis diagram.

FIG. 17 shows an ADS trellis diagram involving the combination of coding of 16/20 coding rate in the recording/reproducing apparatus 50 and the PR1 equalization system described hereinbefore. In this case, the minimum square Euclidean distance is 4, and the maximum number of selectable states is 8. The square mark in FIG. 17 shows each state, white or black in the square mark shows the positive/negative polarity of the recording code after NRZI modulation. The solid line between states shows that the output before NRZI modulation is "1", and the dotted line between states shows that the output before NRZI modulation is "0".

In the trellis diagram shown in FIG. 17, all the QCS are removed by means of trellis removing method, and TD, namely the minimum number of bits of the necessary path memory, is 24 bits.

Figure 3:
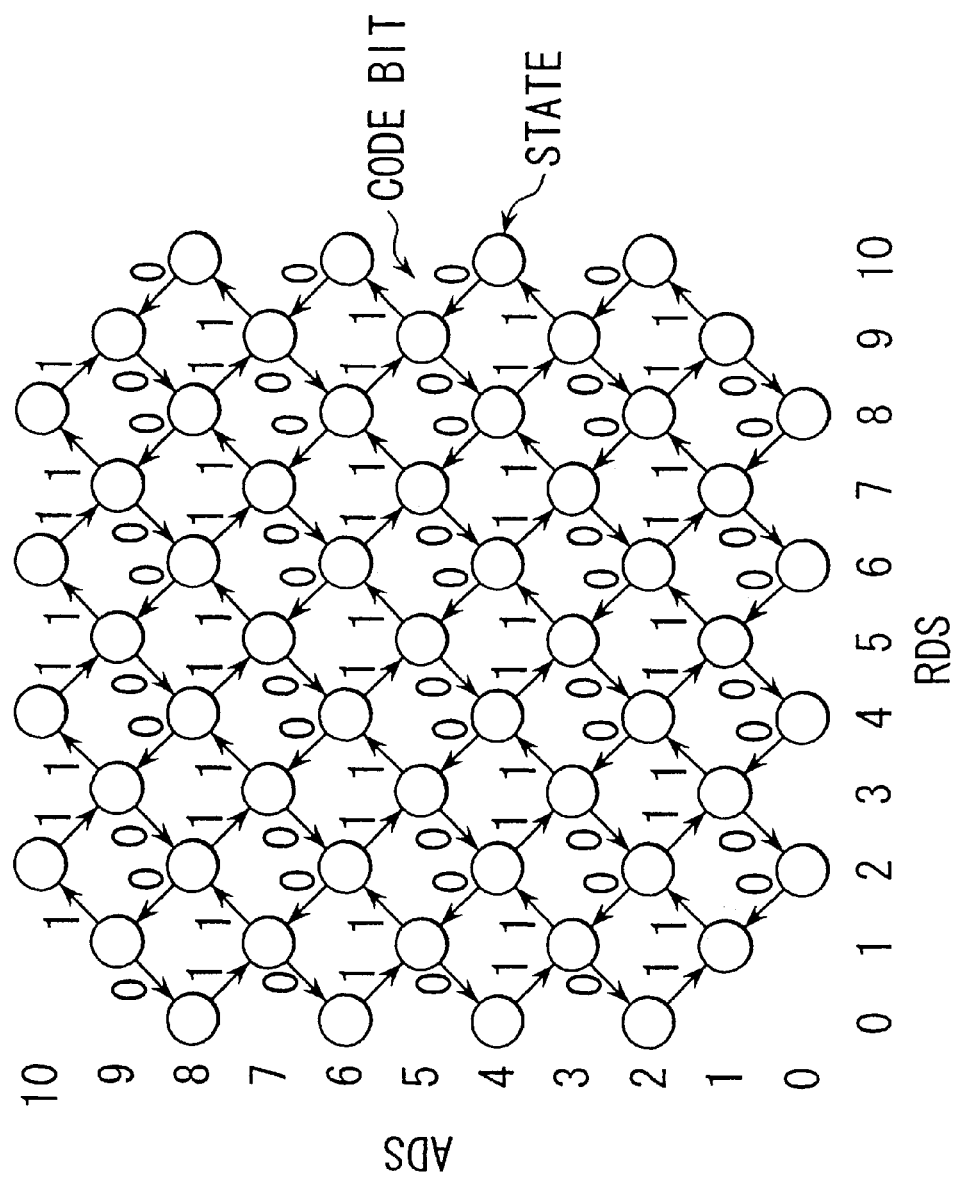
FIG. 3 is a finite state transition diagram.
Figure 4:
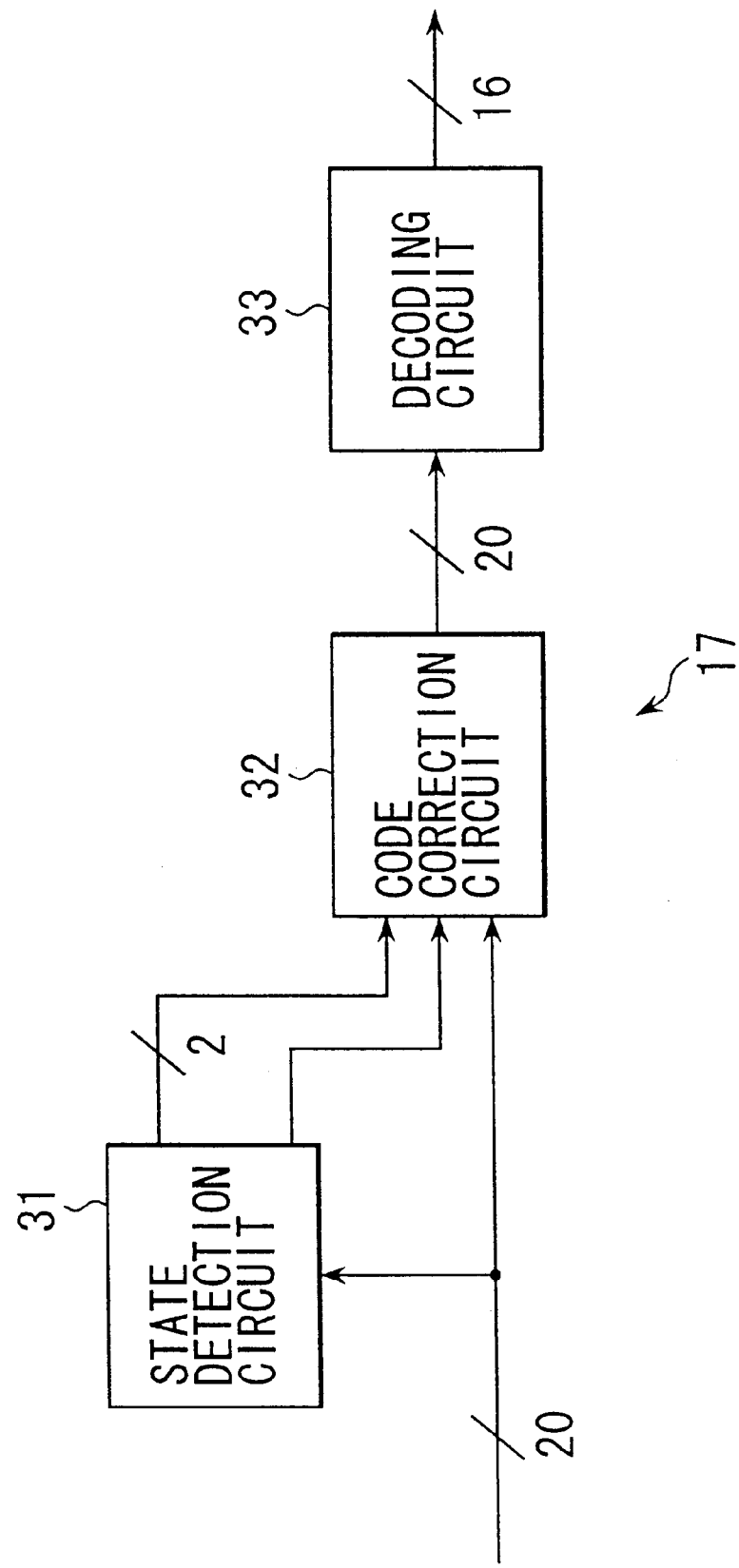
FIG. 4 is a block diagram for illustrating an exemplary structure of a decoder 17 shown in FIG. 1.
Figure 5:
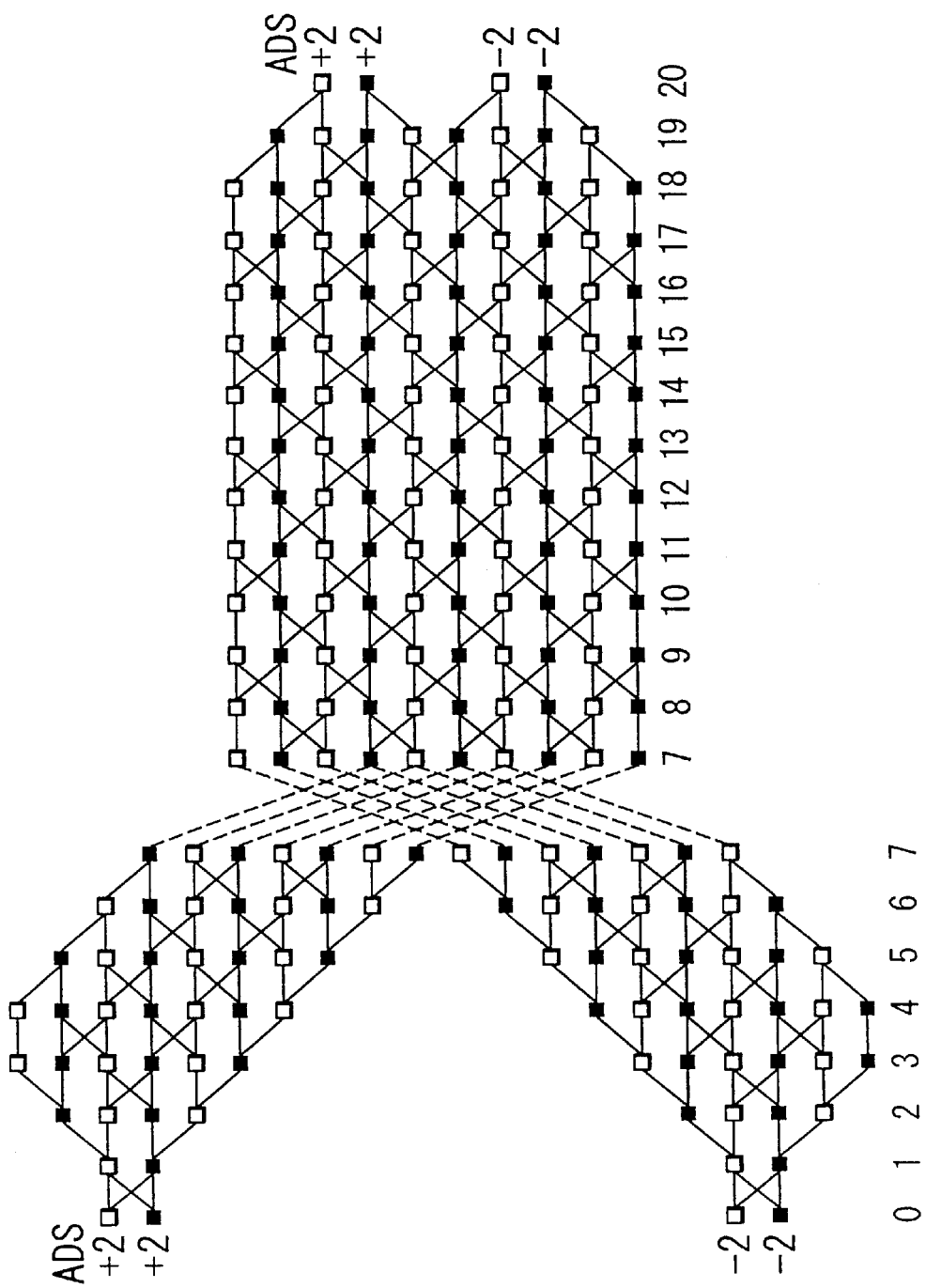
FIG. 5 is a trellis diagram.

In other words, TD is 33 bits in the ADS trellis diagram corresponding to 16/20 coding processing based on the finite state transition diagram shown in FIG. 3 on the premise of NRZ modulation shown in FIG. 5; on the other hand, TD is 24 bits in this example, and the structure of the decoder 52 becomes simpler.

The trellis diagram shown in FIG. 17 is corresponding to the case in which the code is detected in 1 bit units, and otherwise the code may be detected in units of a plurality of bits in order to improve the operation speed of the code detection circuit 16, and the parallel processing may be employed.

Figure 18:
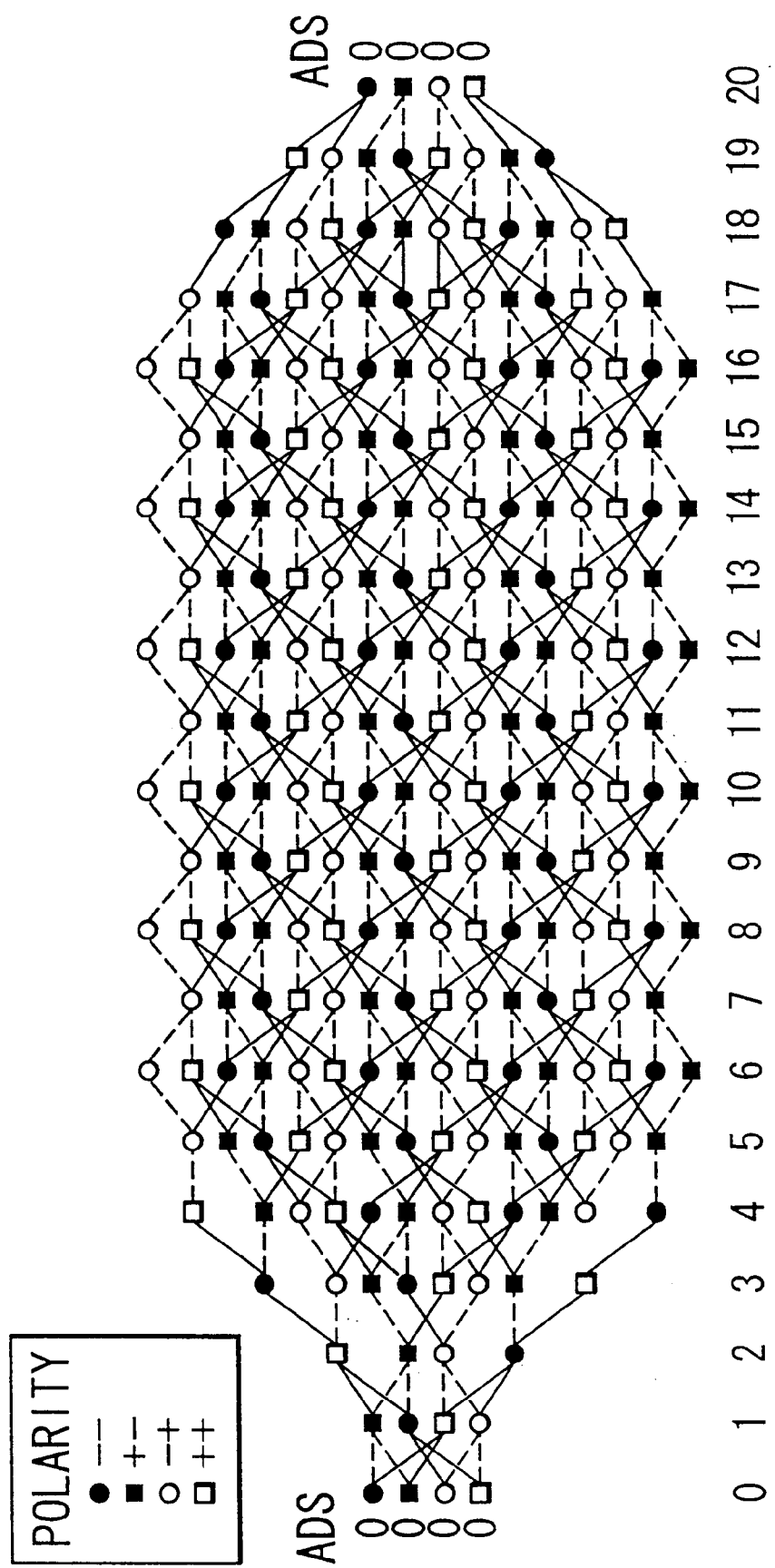
FIG. 18 is another trellis diagram.

FIG. 18 shows the ADS trellis diagram involving the case in which the coding of 16/20 coding rate in the recording/reproducing apparatus 50 and the PR2 equalization system are combined. In this case, the minimum square Euclidean distance is 6, and the maximum number of selectable states is 16. In FIG. 18, circular and square marks show each state, white or black in the circular and square marks shows the positive/negative polarity of the recording code after NRZI modulation of the preceding bit. The solid line starting from each state indicates that the output before NRZI modulation is "1", and the dotted line indicates that the output before NRZI modulation is "0".

As for the ADS trellis diagram in the case that PR2 equalization is applied to MSN code, the trellis diagram in the case that the maximum number of selectable states is 5 that uses EMM (even-mark modulation) code is disclosed, but the regular trellis diagram that is accommodable to multiple state ADS as the trellis diagram shown in FIG. 18 is not disclosed. Generally, PR2 equalization system is more effective in noise suppression of high line recording density area (high frequency band) than PR1 equalization system, and high line recording density is realized.

Figure 19:
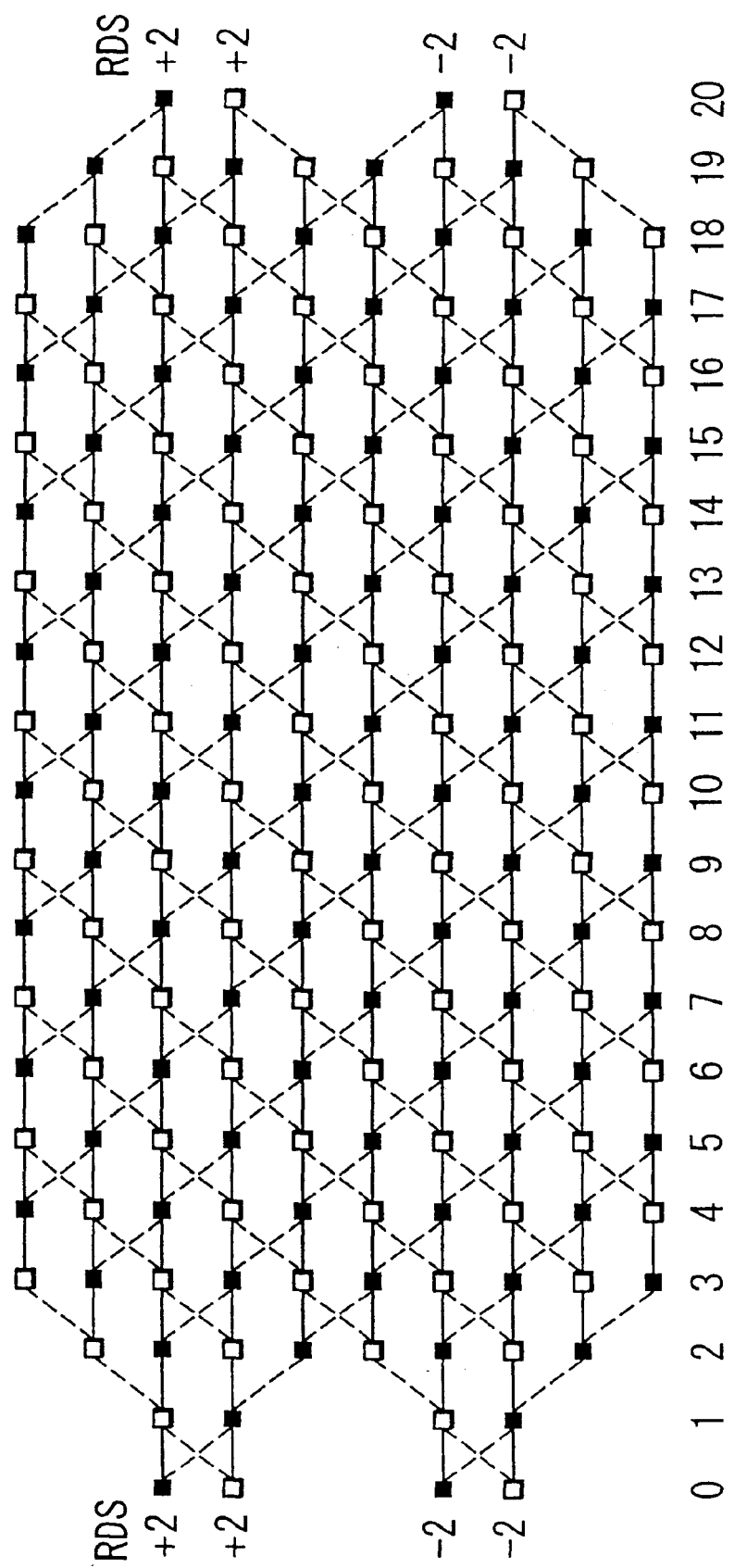
FIG. 19 is another trellis diagram.

FIG. 19 shows the RDS trellis diagram used for 16/20 coding in the recording/reproducing apparatus 50. In FIG. 19, white and black squares shows the positive/negative polarity of the recording code after NRZI modulation of each state, the solid line starting from each state indicates that the output before NRZI modulation is "1", and the dotted line indicates that the output before NRZI modulation is "0". In the trellis diagram shown in FIG. 19, because QCS is not removed, this trellis diagram cannot be used for code detection.

It has been known heretofore that the duplicate code word that can take the start point and the end point at a plurality of states (in this example, the state 4 and the state 5) can be assigned to the data word in one-to-one relation on the condition that NRZI modulation is applied. For example, in the above-mentioned coding of 8/10 coding rate that has been practically used in the DAT, DDS, or AIT1 system, coding is performed based on NRZI modulation, and one duplicate code word is assigned to one data word.

However, in the case of MSN code, only the coding based on NRZ modulation premise is performed, and two code words that are in total inversion relation is assigned to one data word. The reason is that the state transition diagram for restricting both DSV and ADSV based on NRZI modulation premise has not been found, and furthermore in the MSN code from which QCS are removed, the code word that takes the start point at a plurality of states is regarded as the different code word, the existence of the duplicate code word is not recognized, and the finite state transition diagram accommodable for the case that the existence of the duplicate code word is recognized has not been found.

As the result, in the conventional MSN code, the finite state transition diagram is structured on the NRZ modulation premise. Even though the finite state transition diagram is structured on the NRZI modulation premise, the number of code words as same as that in the case based on NRZ modulation premise is assigned to the data word. The apparatus in which MSN code is realized by means of NRZI modulation like the apparatus of the present invention has not been disclosed.

In the present invention, coding is performed according to the finite state transition diagram (FIG. 8) having the regular structure in which the code state is determined based on RDS* and ADS* obtained by multiplying RDS and ADS by the code polarity based on NRZI modulation premise, and in the case that the trellis removing method is applied to the trellis diagram in which only any one restriction of DSV and ADSV is used in MSN code having DSV and ADSV that are both finite value, more code words than those used in the case of NRZ modulation premise are assigned to the data word by combining the principle that a duplicate code word is generated in the MSN code from which QCS has been removed and the NRZI modulation However, the decoded data is independent of the inversion of the code polarity in the case of the present embodiment, and it is quite true for the code based on I-NRZI (interleaved NRZI) modulation. Furthermore, as it is obvious from the above-mentioned description, by using a recording medium in which MSN code that is coded according to coding method in accordance with the present invention is recorded, the circuit structure of the reproducing apparatus can be simplified the more in comparison with the recording medium in which MSN code that is coded according to the conventional coding method is recorded. In the case of the present invention, the DC/Nyquist free code that is obtained by removing QCS by trellis removing method from the n bit code word obtained by converting m bit data word is subjected to NRZI modulation, and it is recorded continuously.

When NRZI modulation is combined with PR1 equalization system, because NRZI modulation is equivalent to $1/(1+D)$, namely the pre-coding operation of PR1 equalization, the number of bits of error propagation is suppressed to a low level. In detail, because the number of error propagation bits in the partial response channel in which the pre-coding operation is performed is equal to the square Euclidean distance at the time of signal detection when an error occurs. By using MSN code to which PR1 equalization is applied based on NRZI modulation premise, the number of error propagation bits is reduced.

In the above, an exemplary case in which RDS* is +2 and ADS* is 0, or RDS* is −2 and ADS* is 0 for the start point and the ending point is described, but the present invention may be applied to the code word having the start point and the end point at other states.

The above-mentioned series of processing can be performed not only by means of hardware, but also by means of software. In the case that a series of processing is performed by means of software, a program that constitutes the software is installed from a program storing medium to a computer that is incorporated in the exclusive hardware or, for example, a general purpose personal computer that is rendered capable of performing various functions by installing various programs.

The above-mentioned series of processing can be performed not only by means of hardware but also by means of software. A recording/reproducing apparatus for performing the series of processing by means of software will be described below.

Figure 20:
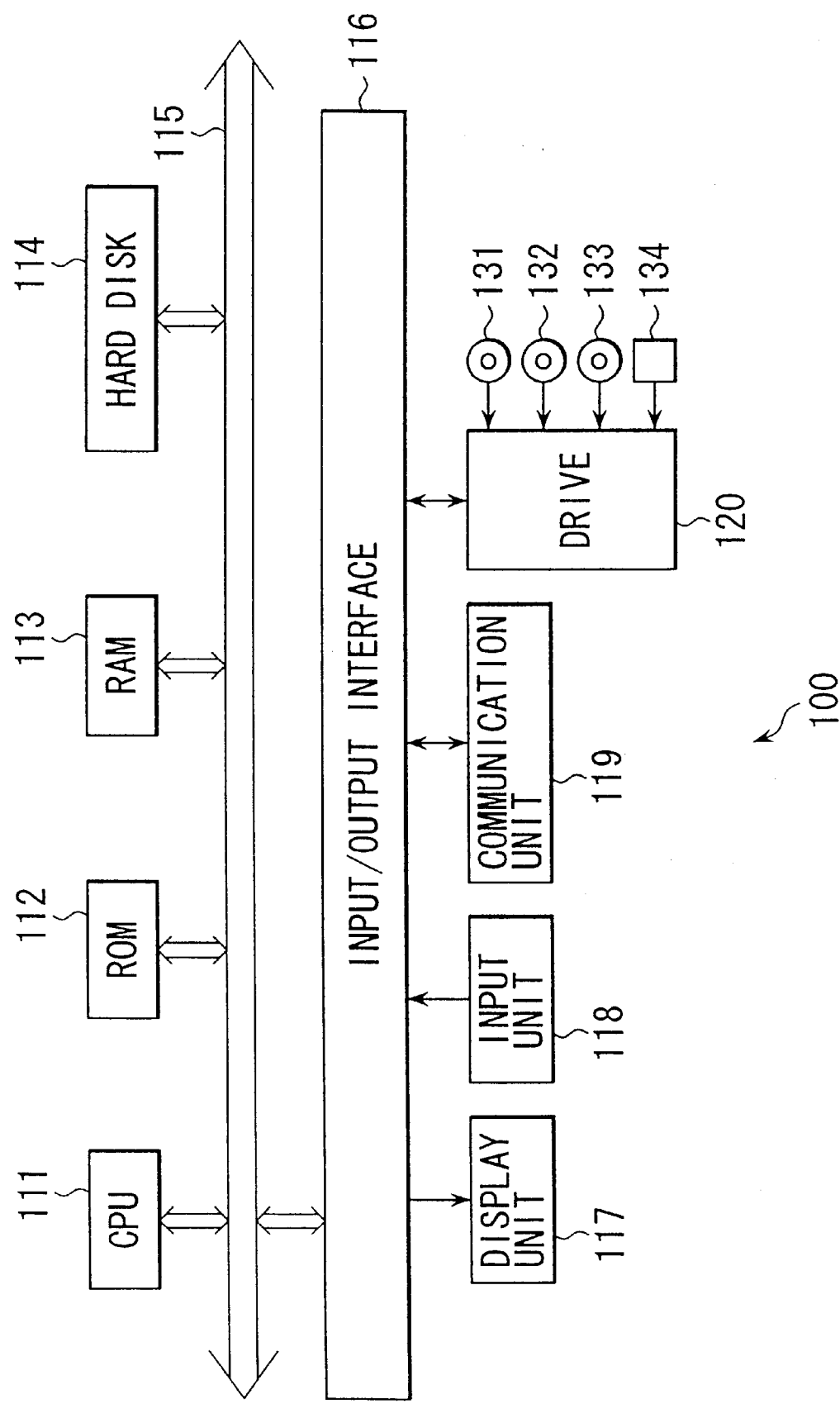
FIG. 20 is a diagram for describing a medium.

A recording/reproducing apparatus 101 shown in FIG. 20 comprises, for example, a computer. A CPU (Central Processing Unit) 111 is connected to an input/output interface 116 through a bus 115. Upon receiving a command from an input unit 118 such as a keyboard or a mouse through the input/output interface 116 when a user operates the input unit 118, the CPU 11 loads a program stored in a recording medium such as a ROM (Read Only Memory) 112, a hard disk 114, or a magnetic disk 131, an optical disc 132, a magneto-optic disc 133, or a semiconductor memory 134 mounted on a drive 120 and executes the program. Furthermore, the CPU 111 supplies the processing result to a display unit 117 comprising a LCD (Liquid Crystal Display) through, for example, the input/output interface 116 as required. The program is stored previously in the hard disk 114 or the ROM 112 and provided to a user together with the recording/reproducing apparatus 101, or the program is provided to a user as a package medium such as the magnetic disc 131, optical disc 132, magneto-optic disc 133, semiconductor memory 134 or the like, and otherwise provided to the hard disk 114 from a satellite or a network through a communication unit 119.

In the present patent specification, the term "system" means an integrated apparatus comprising a plurality of apparatus and means.

According to the present invention, in the coding apparatus, the coding method, and the recording medium, the more code words are assigned to the data word in comparison with the case of NRZ modulation because the trellis code word is subjected to NRZI modulation.

According to the present invention, in the decoding apparatus, the decoding method, and the recording medium, decoding is performed without influence of polar inversion of the decoded code because decoding is performed without referring to the tail code.

According to the present invention, in the decoding apparatus, the decoding method, and the recording medium, decoding is performed without influence of polar inversion of the decoded code because the trellis code word that can take the start point at a plurality of states is decoded without referring to the head code.

According to the present invention, in the recording medium, for example, the structure of a reproducing apparatus is simplified because DC/Nyquist free code from which the quasi-catastrophic sequence has been removed by means of trellis removing method is subjected to NRZI modulation.

What is claimed is:

1. A coding apparatus comprising:
   generation means for generating at least one trellis code word from which a quasi-catastrophic sequence has been removed, said at least one trellis code word having a start point and an end point, said at least one trellis code word generated by removing a DC component and a Nyquist frequency component of a code spectrum from at least one input data word when maximum likelihood is detected, wherein said at least one trellis code word is assigned to said at least one data word; and
   modulation means for NRZI-modulating said at least one trellis code word generated by said generation means.

2. A coding apparatus as claimed in claim 1, wherein said at least one input data word has 16 bits, and said at least one trellis code word has 20 bits.

3. A coding apparatus as claimed in claim 1, wherein said at least one trellis code word generated by said generation means has four or less consecutive 0s from a head code of said at least one trellis code word, six or less consecutive 0s in an intermediate code of said at least one trellis code word, and three or less consecutive 0s to a tail code of said at least one trellis code word.

4. A coding apparatus as claimed in claim 1, wherein said generation means further comprises removing means for removing said quasi-catastrophic sequence.

5. A coding apparatus as claimed in claim. 1, wherein a DC accumulation charge of the start point and the end point of said at least one trellis code word generated by said generation means is −2 or +2, and an AC accumulation charge is 0.

6. A coding apparatus as claimed in claim 5, wherein a difference between a maximum value and a minimum value of said DC accumulation charge is equal to or greater than 10, and a difference between a maximum value and a minimum value of said AC accumulation charge is equal to or greater than 8.

7. A coding apparatus as claimed in claim 5, wherein a difference between a maximum value and a minimum value of said DC accumulation charge is equal to 10, and a difference between a maximum value and a minimum value of said AC accumulation charge is equal to 8.

8. A coding method comprising:
   a generation step for generating a trellis code word from which a quasi-catastrophic sequence has been removed, said trellis code word generated by removing a DC component and a Nyquist frequency component of a code spectrum from an input data word when maximum likelihood is detected, wherein said trellis code word is assigned to said input data word; and
   a modulation step for NRZI-modulating said trellis code word generated in said generation step.

9. A recording medium storing a program for operating a computer to execute processing, including:
   a generation step for generating a trellis code word from which a quasi-catastrophic sequence has been removed, said trellis code word generated by removing a DC component and a Nyquist frequency component of a code spectrum from an input data word when maximum likelihood is detected; and
   a modulation step for NRZI-modulating said trellis code word generated in said generation step.

10. A recording medium, comprising:
   a recording area configured to enable consecutive recording of an n bit code word formed by coding an m bit data word, said n bit code word generated by removing a DC component and a Nyquist frequency component of a code spectrum from said m bit data word when maximum likelihood is detected, wherein said n bit code word is NRZI-modulated before being recorded onto the recording area.

11. A decoding apparatus for decoding a code word to a data word, the apparatus comprising:

demodulation means for demodulating at least one NRZI-modulated trellis code word having a head code and a tail code; and decoding means for decoding said at least one demodulated trellis code word, from which a quasi-catastrophic sequence has been removed, each code word of said at least one trellis code word including a start point and an end point, said decoding means configured to decode said at least one trellis code word without referring to the tail code to produce the data word, wherein the end point of said each code word is placed at a plurality of states based on a finite state transition diagram.

12. A decoding method for decoding a code word to a data word, the method comprising:

demodulating at least one NRZI-modulated trellis code word having a head code and a tail code; and decoding said at least one demodulated trellis code word, from which a quasi-catastrophic sequence has been removed, each code word of said at least one trellis code word including a start point and an end point, said at least one trellis code word decoded to produce the data word without referring to the tail code, wherein the end point of said each code word is placed at a plurality of states based on a finite state transition diagram.

13. A recording medium recording a program, which is a decoding program for decoding a code word to a data word by operating a computer to execute the program, the program comprising:

demodulating at least one NRZI-modulated trellis code word having a head code and a tail code; and decoding said at least one demodulated trellis code word, from which a quasi-catastrophic sequence has been removed, each code word of said at least one trellis code word including a start point and an end point, said at least one trellis code word decoded to produce the data word without referring to the tail code, wherein the end point of said each code word is placed at a plurality of states based on a finite state transition diagram.

* * * * *